United States Patent
Shinohara et al.

(10) Patent No.: US 9,625,168 B2
(45) Date of Patent: Apr. 18, 2017

(54) EXHAUST SYSTEM

(75) Inventors: Toyoji Shinohara, Tokyo (JP);
Kohtaro Kawamura, Tokyo (JP);
Toshiharu Nakazawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 1072 days.

(21) Appl. No.: 13/813,850

(22) PCT Filed: Jul. 25, 2011

(86) PCT No.: PCT/JP2011/067566
§ 371 (c)(1),
(2), (4) Date: Mar. 12, 2013

(87) PCT Pub. No.: WO2012/017972
PCT Pub. Date: Feb. 9, 2012

(65) Prior Publication Data
US 2013/0171919 A1    Jul. 4, 2013

(30) Foreign Application Priority Data
Aug. 5, 2010    (JP) .................................. 2010-176552

(51) Int. Cl.
*F24F 7/00*    (2006.01)
*F04B 37/16*    (2006.01)
(Continued)

(52) U.S. Cl.
CPC ............. *F24F 7/00* (2013.01); *B01D 53/005* (2013.01); *F04B 37/14* (2013.01); *F04B 49/06* (2013.01);
(Continued)

(58) Field of Classification Search
None
See application file for complete search history.

(56) References Cited

U.S. PATENT DOCUMENTS 5,443,644 A * 8/1995 Ozawa ................ C23C 16/4412
118/715
5,731,592 A    3/1998 Oh et al.
(Continued)

FOREIGN PATENT DOCUMENTS

JP        04-330388 A    11/1992
JP        10-252651 A     9/1998
(Continued)

OTHER PUBLICATIONS

European Patent Application No. 11814598.6; Extended Search Report; dated Oct. 11, 2016; 5 pages.
(Continued)

*Primary Examiner* — Gregory Huson
*Assistant Examiner* — Eric Gorman
(74) *Attorney, Agent, or Firm* — Baker & Hostetler LLP

(57) ABSTRACT

An exhaust system (2) is used for evacuating a chamber of a manufacturing apparatus (1) for manufacturing semiconductor devices, liquid crystal panels, LEDs, or solar cells. The exhaust system (2) includes a vacuum pump apparatus (3) for evacuating the chamber, an exhaust gas treatment apparatus (5) for treating an exhaust gas discharged from the chamber, and a controller (6) for controlling the vacuum pump apparatus (3) and/or the exhaust gas treatment apparatus (5). Information of operation process of the manufacturing apparatus (1), and the kind of gas and the flow rate of the gas supplied to the manufacturing apparatus (1) is inputted into the controller (6) to control the vacuum pump apparatus (3) and/or the exhaust gas treatment apparatus (5).

13 Claims, 8 Drawing Sheets

(51) Int. Cl.
*B01D 53/46* (2006.01)
*F04B 49/10* (2006.01)
*H01L 21/205* (2006.01)
*F04B 51/00* (2006.01)
*G01M 13/00* (2006.01)
*B01D 53/00* (2006.01)
*F04B 37/14* (2006.01)
*F04B 49/06* (2006.01)
*B01D 53/78* (2006.01)

(52) U.S. Cl.
CPC ...... *B01D 53/78* (2013.01); *B01D 2258/0216* (2013.01); *F04B 2201/1201* (2013.01)

(56) References Cited

U.S. PATENT DOCUMENTS

| | | | |
|---|---|---|---|
| 5,769,626 A | 6/1998 | Hauff et al. | |
| 6,033,479 A * | 3/2000 | Ikeda | B08B 9/032 118/688 |
| 6,322,756 B1 * | 11/2001 | Arno | B01D 53/14 422/171 |
| 6,388,263 B1 * | 5/2002 | Song | H01J 37/18 250/492.21 |
| 6,716,477 B1 * | 4/2004 | Komiyama | C23C 16/44 427/8 |
| 2005/0095774 A1 * | 5/2005 | Ushiku | G05B 19/4184 438/222 |
| 2005/0109374 A1 * | 5/2005 | Letessier | B08B 9/00 134/22.1 |
| 2006/0030966 A1 * | 2/2006 | Huang | G06Q 10/06 700/121 |
| 2006/0259198 A1 * | 11/2006 | Brcka | G05B 19/4184 700/246 |
| 2007/0012099 A1 * | 1/2007 | Becourt | F04B 37/14 73/168 |
| 2007/0095282 A1 * | 5/2007 | Moon | B08B 7/0035 118/715 |
| 2007/0286766 A1 * | 12/2007 | Choi | C23C 16/4412 422/23 |
| 2010/0076729 A1 * | 3/2010 | Davis | H01L 21/67276 702/184 |
| 2012/0046774 A1 * | 2/2012 | Nakamura | H01L 21/67017 700/100 |
| 2012/0227388 A1 * | 9/2012 | Asakage | E02F 9/2095 60/311 |
| 2013/0139690 A1 * | 6/2013 | Ohuchi | B01D 53/02 96/4 |
| 2014/0352820 A1 * | 12/2014 | Nakazawa | C23C 16/4408 137/565.01 |
| 2015/0260192 A1 * | 9/2015 | Iwasaki | F04D 19/04 415/183 |

FOREIGN PATENT DOCUMENTS

| | | |
|---|---|---|
| JP | 2001-189277 A | 7/2001 |
| JP | 2002-285974 A | 10/2002 |
| JP | 2003-077907 A | 3/2003 |
| JP | 2004-014699 A | 1/2004 |
| JP | 2008-147215 A | 6/2008 |
| JP | 2009-203945 A | 9/2009 |
| TW | 319887 B | 11/1997 |
| TW | 460975 B | 10/2001 |
| TW | I267139 B | 11/2006 |
| TW | 200806807 A | 2/2008 |
| WO | WO 2004/070802 A1 | 8/2004 |
| WO | 2009/147426 A1 | 12/2009 |

OTHER PUBLICATIONS

International Patent Application No. PCT/JP2011/067566; Int'l Search Report; dated Oct. 25, 2011; 4 pages.

* cited by examiner

EXHAUST SYSTEM

CROSS REFERENCE TO RELATED APPLICATION

This application is a 35 U.S.C. 371 National Phase Entry Application from PCT/JP2011/067566, filed Jul. 25, 2011, which claims the benefit of Japanese Patent Application No. 2010-176552 filed on Aug. 5, 2010, the disclosures of which are incorporated herein in its entirety by reference.

TECHNICAL FIELD

The present invention relates to an exhaust system in a manufacturing apparatus for manufacturing semiconductor devices, liquid crystal panels, LEDs, or the like, and more particularly to an exhaust system which has a vacuum pump for evacuating a chamber of the manufacturing apparatus, an exhaust gas treatment apparatus for treating an exhaust gas discharged from the chamber, and other apparatuses.

BACKGROUND ART

In a manufacturing process for manufacturing semiconductor devices, liquid crystal panels, LEDs, solar cells or the like, a process gas is introduced into a process chamber which is being evacuated to perform various processes such as an etching process, a CVD process or the like. The process chamber for performing several processes such as an etching process, a CVD process or the like is evacuated by a vacuum pump. Further, the process chamber and exhaust apparatuses connected to the process chamber are cleaned periodically by supplying a cleaning gas thereto. Because exhaust gases such as the process gas, the cleaning gas or the like contain a silane-based gas ($SiH_4$, TEOS or the like), a halogen-based gas ($NF_3$, $ClF_3$, $SF_6$, $CHF_3$ or the like), a PFC gas ($CF_4$, $C_2F_6$ or the like) or the like, such exhaust gases have negative effects on the human body and on the global environment such as global warming. Therefore, it is not preferable that these exhaust gases are emitted to the atmosphere as they are. Accordingly, these exhaust gases are made harmless by the exhaust gas treatment apparatus provided at a downstream side of the vacuum pump, and the harmless exhaust gases are emitted to the atmosphere. Further, the exhaust gases discharged from the process chamber contain a gas such as $SiH_4$ at high risk of combustion and explosion, and hence it has been customary to supply an $N_2$ gas from a diluent $N_2$ unit into the exhaust gases to dilute the exhaust gases. Further, in some cases, an exhaust from several chambers other than the process chamber such as a transfer chamber, a load lock chamber or the like of the manufacturing apparatus is connected to the vacuum pump and the exhaust gas treatment apparatus where an exhaust gas is treated.

In this manner, the exhaust system of a chamber in a semiconductor manufacturing apparatus, a liquid crystal panel manufacturing apparatus, an LED manufacturing apparatus or the like has the vacuum pump, the diluent $N_2$ unit, the exhaust gas treatment apparatus and the like, and each apparatus of the exhaust system is operated by ON/OFF control based on signals from the manufacturing apparatus. For example, in the case where the semiconductor manufacturing apparatus is an LP-CVD apparatus, operational sequence in the manufacturing apparatus is as follows: wafer supply→vacuum drawing→temperature rise→film forming (material gas supply)→temperature fall→return to atmospheric pressure→wafer removal. The above operational sequence is repeated. Further, in order to remove solid matters which have adhered to the interior of the chamber, a cleaning gas (e.g., HF, $ClF_3$, $NF_3$ or the like) is supplied periodically into the chamber, and the chamber is evacuated. The vacuum pump is activated in response to a start signal for vacuum drawing from the manufacturing apparatus when the vacuum drawing step of the chamber is started, and the vacuum pump is stopped in response to a signal for return to atmospheric pressure from the manufacturing apparatus when the return step to atmospheric pressure of the chamber is started. Further, the exhaust gas treatment apparatus is activated in response to a start signal for film forming when the film forming step in the process chamber is started, and the exhaust gas treatment apparatus is operated during the film forming step. After the completion of the film forming step, the exhaust gas treatment apparatus is operated for a predetermined time and stopped. The diluent $N_2$ unit also performs supply of the $N_2$ gas and supply stop of the $N_2$ gas in response to signals from the manufacturing apparatus. In this manner, each apparatus of the exhaust system is operated by ON/OFF control based on signals for starting and finishing of predetermined operation processes in the manufacturing apparatus.

The exhaust gas treatment apparatus is disclosed in Japanese laid-open patent publication No. 09-861, for example. The cleaning apparatus of pipes is disclosed in Japanese laid-open patent publication No. 2001-189277, for example.

SUMMARY OF INVENTION

Technical Problem

As described above, in a conventional exhaust system of a chamber in a semiconductor manufacturing apparatus or the like, a vacuum pump, an exhaust gas treatment apparatus, a diluent $N_2$ unit and the like are controlled based on signals of predetermined operation processes in the manufacturing apparatus. Optimal operating conditions of the vacuum pump, the exhaust gas treatment apparatus and the diluent $N_2$ unit are different from each other according to the kind of gas and the flow rate of the gas supplied to the chamber. However, conventionally, no regard has been given to this difference in the optimal operating conditions. For example, there is a correlation between the kind of gas and the flow rate of the gas supplied to the chamber, and ultimate pressure and exhaust velocity of the vacuum pump (i.e., pumping capacity of the vacuum pump). However, conventionally, regardless of the kind of gas and the flow rate of the gas supplied to the chamber, the vacuum pump has been operated based on predetermined specifications. Therefore, in some cases, the vacuum pump has been operated with excess pumping capacity.

Further, in a combustion-type exhaust gas treatment apparatus, there is a correlation between the kind of gas and the flow rate of the gas supplied to the chamber, and respective supply quantities of fuel, oxygen and air in the exhaust gas treatment apparatus (i.e., combustion capacity of the exhaust gas treatment apparatus). However, conventionally, regardless of the kind of gas and the flow rate of the gas supplied to the chamber, the exhaust gas treatment apparatus has been operated based on predetermined specifications. As a result, in some cases, the exhaust gas treatment apparatus has been operated with excess combustion capacity.

Moreover, also in the diluent $N_2$ unit, excess diluent $N_2$ has been supplied to the exhaust gas from the chamber.

Therefore, in the conventional exhaust system of the manufacturing apparatus, excess energy has been consumed in each apparatus constituting the exhaust system, and excess energy has been consumed also in the entire exhaust system.

Further, in the exhaust system of the manufacturing apparatus or the like, reaction products adhere in powder form to the vacuum pump, the exhaust gas treatment apparatus, connecting pipes and the like. Thus, in some cases, a cleaning gas is allowed to flow from the manufacturing apparatus to each apparatus to clean each apparatus of the exhaust system. In this case, conventionally, the cleaning gas has been allowed to flow to clean the exhaust system based on data accumulated from operational experience. Therefore, the exhaust system has not been cleaned at the right time. In the case where timing of cleaning is delayed, blocking of the pipe or stopping of the vacuum pump occurs due to the powder, and in the case where timing of cleaning is early, it becomes a waste of consumption of the cleaning gas.

Further, in the exhaust gas treatment apparatus, the exhaust gas is combusted by supplying fuel, oxygen and air into the exhaust gas, and residue such as powder remaining after combustion is trapped by a water shower and stored in a tank. Therefore, maintenance such as treatment of drainage in the tank, cleaning of the tank or the like is required. In this case, conventionally, maintenance in the exhaust gas treatment apparatus such as treatment of drainage in the tank, cleaning of the tank or the like has been performed based on information of the number of processed wafers or the like obtained at the manufacturing apparatus side. Accordingly, in many cases, there has been plenty room for treatment capacity of the exhaust gas treatment apparatus.

The present invention has been made in view of the above-mentioned conventional drawbacks. It is therefore an object of the present invention to provide an exhaust system which can operate a vacuum pump, an exhaust gas treatment apparatus, a diluent $N_2$ unit and the like under optimal operating conditions by inputting operation process in a manufacturing apparatus for manufacturing semiconductors, liquid crystal panels, LEDs or the like, and the kind of gas and the flow rate of the gas supplied to the manufacturing apparatus into a controller of the exhaust system, and can maintain apparatuses of the exhaust system at the right time by outputting maintenance request of the apparatuses at the exhaust system side to the manufacturing apparatus side.

Solution to Problem

In order to achieve the above object, according to a first aspect of the present invention, there is provided an exhaust system for evacuating a chamber of a manufacturing apparatus for manufacturing semiconductor devices, liquid crystal panels, LEDs, or solar cells comprising: a vacuum pump apparatus configured to evacuate the chamber; an exhaust gas treatment apparatus configured to treat an exhaust gas discharged from the chamber; a pipe for connecting the manufacturing apparatus, the vacuum pump apparatus and the exhaust gas treatment apparatus; and a controller configured to control the vacuum pump apparatus and/or the exhaust gas treatment apparatus; wherein information of operation process of the manufacturing apparatus, and the kind of gas and the flow rate of the gas supplied to the manufacturing apparatus is inputted into the controller to control the vacuum pump apparatus and/or the exhaust gas treatment apparatus.

According to the first aspect of the present invention, because information of operation process of the manufacturing apparatus, and the kind of gas and the flow rate of the gas supplied to the manufacturing apparatus is inputted into the controller to control the vacuum pump apparatus or the exhaust gas treatment apparatus, the vacuum pump apparatus can be operated at the optimal pumping capability and the exhaust gas treatment apparatus can be operated at the optimal treatment capability according to the kind of gas and the flow rate of the gas supplied to the manufacturing apparatus. Therefore, power consumption in the vacuum pump apparatus can be reduced. Further, fuel or the like in the exhaust gas treatment apparatus can be reduced and energy-saving can be achieved.

In a preferred aspect of the present invention, the controller is configured to control one or more of supply quantity of $N_2$ gas, supply quantity of water, electric power, supply quantities of fuel, oxygen and air, heater temperature, and plasma output based on the information of the operation process of the manufacturing apparatus and the kind of gas and the flow rate of the gas supplied to the manufacturing apparatus.

According to the present invention, because the supply quantity of the $N_2$ gas supplied to, for example, the vacuum pump apparatus can be controlled based on the information of the operation process of the manufacturing apparatus and the kind of gas and the flow rate of the gas supplied to the manufacturing apparatus, appropriate quantity of $N_2$ can be supplied to the vacuum pump apparatus. Therefore, the vacuum pump apparatus can be operated stably and explosion and ignition of the combustible gases can be prevented.

Further, the controller is configured to optimally control the supply quantity of water, electric power, and the supply quantities of fuel, oxygen and air based on the information of the operation process of the manufacturing apparatus and the kind of gas and the flow rate of the gas supplied to the manufacturing apparatus. Therefore, the supply quantity of water, electric power, and the supply quantities of fuel, oxygen and air can be reduced.

In a preferred aspect of the present invention, when maintenance is required for the vacuum pump apparatus or the exhaust gas treatment apparatus, the controller outputs information of maintenance request to the manufacturing apparatus.

According to the present invention, when maintenance is required for the vacuum pump apparatus or the exhaust gas treatment apparatus, the controller outputs information of maintenance request to the manufacturing apparatus. Thus, the vacuum pump apparatus or the exhaust gas treatment apparatus can be maintained at the right time. Therefore, equipment failure in the exhaust system can be prevented, and stable operation of the manufacturing apparatus can be ensured.

In a preferred aspect of the present invention, the controller is configured to predict the time requiring maintenance of the vacuum pump apparatus or the exhaust gas treatment apparatus from the kind of gas and an accumulated supply quantity of the gas supplied to the manufacturing apparatus or to predict the kind of gas to be treated and an available supply quantity of the gas to be treated until maintenance is required for the vacuum pump apparatus or the exhaust gas treatment apparatus, and to output the prediction information to the manufacturing apparatus.

According to the present invention, because the time requiring maintenance in the apparatuses of the exhaust system can be predicted, the operation process of the manufacturing apparatus can be determined in consideration of the time requiring maintenance of the exhaust system.

In a preferred aspect of the present invention, the controller is configured to control rotational speeds of the vacuum pump apparatus based on the information of the operation process of the manufacturing apparatus and the kind of gas and the flow rate of the gas supplied to the manufacturing apparatus.

According to the present invention, the vacuum pump apparatus can be controlled to operate at the optimal rotational speeds according to the kind of gas and the flow rate of the gas supplied to the manufacturing apparatus. Therefore, the vacuum pump apparatus can be operated at the optimal pumping capability in response to the kind of gas and the flow rate of the gas in the manufacturing apparatus.

In a preferred aspect of the present invention, the controller is configured to control one or more of supply quantities of fuel, oxygen and air of the exhaust gas treatment apparatus, heater temperature and plasma output based on the information of the operation process of the manufacturing apparatus and the kind of gas and the flow rate of the gas supplied to the manufacturing apparatus.

According to the present invention, supply quantities of fuel, oxygen and air of the exhaust gas treatment apparatus can be controlled at optimal quantities in response to the kind of gas and the flow rate of the gas supplied to the manufacturing apparatus. Therefore, the exhaust gas treatment in the exhaust gas treatment apparatus can be performed stably and supply quantities of fuel, oxygen and air can be reduced.

In a preferred aspect of the present invention, the information of maintenance request is obtained from the kind of gas and an accumulated supply quantity of the gas supplied to the manufacturing apparatus.

According to the present invention, the kind of gas and an accumulated supply quantity of the gas supplied to the manufacturing apparatus correspond to load with time which is carried by apparatuses of the exhaust system, and thus are effective as indicators of the time requiring maintenance of the respective apparatuses of the manufacturing apparatus. When the operation process of the manufacturing apparatus, the kind of supply gas and the flow rate of supply gas are inputted into the controller from the manufacturing apparatus, the controller calculates an accumulated supply quantity of the gas supplied to the manufacturing apparatus by adding the flow rate of the supply gas inputted into the controller, and when the accumulated supply quantity requiring maintenance in the apparatuses of the exhaust system is reached, the controller outputs maintenance request to the manufacturing apparatus. In this case, typical apparatuses requiring maintenance are the vacuum pump apparatus to which powder adheres and the exhaust gas treatment apparatus in which powder and drainage are accumulated. Needless to say, other apparatuses may require maintenance. In this manner, because the maintenance request can be issued from the exhaust system to the manufacturing apparatus, appropriate maintenance and cleaning of the apparatuses of the exhaust system can be carried out.

In a preferred aspect of the present invention, an exhaust system further comprises: an $N_2$ unit configured to supply an $N_2$ gas into the exhaust gas discharged from the chamber; wherein the information of the operation process of the manufacturing apparatus, and the kind of gas and the flow rate of the gas supplied to the manufacturing apparatus is inputted into the controller to control the $N_2$ unit.

According to the present invention, because supply of the diluent $N_2$ gas (or HOT $N_2$ gas) can be controlled based on the operation process of the manufacturing apparatus, the kind of gas and the flow rate of the gas supplied to the manufacturing apparatus, the supply quantity of the $N_2$ gas can be reduced. Further, because appropriate quantity of $N_2$ can be supplied to the vacuum pump apparatus and the connecting pipe, the vacuum pump can be operated stably and explosion and ignition of the combustible gases can be prevented.

In a preferred aspect of the present invention, an exhaust system further comprises: a pipe heater configured to heat at least part of the pipe for connecting the manufacturing apparatus, the vacuum pump apparatus and the exhaust gas treatment apparatus; wherein the information of the operation process of the manufacturing apparatus, and the kind of gas and the flow rate of the gas supplied to the manufacturing apparatus is inputted into the controller to control the pipe heater.

According to the present invention, the controller can turn the pipe heater on or off at the right time according to the operation process of the manufacturing apparatus and can control the pipe heater at an optimal temperature according to the operation process of the manufacturing apparatus, the kind of gas and the flow rate of the gas supplied to the manufacturing apparatus. Thus, power consumption in the pipe heater can be reduced and energy-saving can be achieved. Further, simultaneously, blocking of the pipe or stopping of the vacuum pump caused by accumulation of powder in the connecting pipe or in the apparatuses such as the vacuum pump apparatus or the like can be prevented.

In a preferred aspect of the present invention, a cleaning gas is evacuated from the manufacturing apparatus to perform cleaning of each apparatus of the exhaust system.

According to the present invention, when the exhaust system becomes cleaning timing, a cleaning gas is evacuated from the manufacturing apparatus to remove powder which has adhered to gas contacting portions of the exhaust system.

In a preferred aspect of the present invention, when the vacuum pump apparatus, the exhaust gas treatment apparatus or the pipe is required for the cleaning due to powder adhesion of the vacuum pump apparatus, the exhaust gas treatment apparatus or the pipe, the controller outputs information of the cleaning request to the manufacturing apparatus.

According to the present invention, by detecting a predetermined amount of powder which has adhered to the vacuum pump apparatus, the exhaust gas treatment apparatus or the connecting pipe, a signal indicative of occurrence of powder adhesion is outputted to the manufacturing apparatus from these apparatuses in the exhaust system. The manufacturing apparatus which has received the signal releases a cleaning gas such as HF, $ClF_3$, or $NF_3$ to the outlet of the manufacturing apparatus. The powder adhesion in the exhaust system can be detected from pressure (exhaust pressure of the vacuum pump, inlet pressure of the exhaust gas treatment apparatus or the like), a load factor of the vacuum pump, the kind of gas and emission time of the gas from the manufacturing apparatus, or the like. According to the present invention, blocking of the pipe or stopping of the vacuum pump caused by the powder can be prevented, and the time for cleaning the powder can be shortened.

In a preferred aspect of the present invention, the controller comprises a controller for controlling all the apparatuses of the exhaust system, or an individual controller for controlling each apparatus of the exhaust system.

According to a second aspect of the present invention, there is provided a control method of an exhaust system for evacuating a chamber of a manufacturing apparatus for manufacturing semiconductor devices, liquid crystal panels, LEDs, or solar cells, the exhaust system comprising: a vacuum pump apparatus configured to evacuate the chamber; an exhaust gas treatment apparatus configured to treat an exhaust gas discharged from the chamber; and a controller configured to control the vacuum pump apparatus and/or the exhaust gas treatment apparatus; the control method comprising: inputting information of operation process of the manufacturing apparatus, and the kind of gas and the flow rate of the gas supplied to the manufacturing apparatus into the controller to control the vacuum pump apparatus and/or the exhaust gas treatment apparatus.

In a preferred aspect of the present invention, the control method further comprises outputting information of maintenance request from the controller to the manufacturing apparatus when maintenance is required for the vacuum pump apparatus or the exhaust gas treatment apparatus.

In a preferred aspect of the present invention, the control method further comprises predicting the time requiring maintenance of the vacuum pump apparatus or the exhaust gas treatment apparatus from the kind of gas and an accumulated supply quantity of the gas supplied to the manufacturing apparatus or predicting the kind of gas to be treated and an available supply quantity of the gas to be treated until maintenance is required for the vacuum pump apparatus or the exhaust gas treatment apparatus by the controller, and outputting the prediction information to the manufacturing apparatus from the controller.

Advantageous Effects of Invention

The present invention can offer the following advantages:
(1) Because information of operation process of the manufacturing apparatus, and the kind of gas and the flow rate of the gas supplied to the manufacturing apparatus is inputted into the controller to control the vacuum pump apparatus and/or the exhaust gas treatment apparatus, the vacuum pump apparatus can be operated at the optimal pumping capability and the exhaust gas treatment apparatus can be operated at the optimal treatment capability according to the kind of gas and the flow rate of the gas supplied to the manufacturing apparatus. Therefore, power consumption in the vacuum pump apparatus can be reduced without lowering the process performance. Further, fuel, power consumption or the like in the exhaust gas treatment apparatus can be reduced and energy-saving can be achieved.
(2) When maintenance is required for the vacuum pump apparatus or the exhaust gas treatment apparatus, the controller outputs information of maintenance request to the manufacturing apparatus. Thus, the vacuum pump apparatus or the exhaust gas treatment apparatus can be maintained at the right time. Therefore, equipment failure in the exhaust system can be prevented, and stable operation of the manufacturing apparatus can be ensured.
(3) Because supply of the diluent $N_2$ gas (or HOT $N_2$ gas) can be controlled based on the operation process of the manufacturing apparatus, the kind of gas and the flow rate of the gas supplied to the manufacturing apparatus, the supply quantity of the $N_2$ gas can be reduced. Further, because appropriate quantity of $N_2$ can be supplied to the vacuum pump apparatus and the connecting pipe, the vacuum pump can be operated stably and explosion and ignition of the combustible gases can be prevented.
(4) The pipe heater can be turned on or off at the right time according to the operation process of the manufacturing apparatus, and the pipe heater can be controlled at an optimal temperature according to the operation process of the manufacturing apparatus, the kind of gas and the flow rate of the gas supplied to the manufacturing apparatus. Thus, power consumption in the pipe heater can be reduced and energy-saving can be achieved. Further, simultaneously, blocking of the pipe or stopping of the vacuum pump caused by accumulation of powder in the connecting pipe or in the apparatuses such as the vacuum pump apparatus or the like can be prevented.
(5) When the exhaust system becomes cleaning timing, a cleaning gas is evacuated from the manufacturing apparatus to remove powder which has adhered to gas contacting portions of the exhaust system. Therefore, blocking of the pipe or stopping of the vacuum pump caused by the powder can be prevented, and the time for cleaning the powder can be shortened.

DESCRIPTION OF EMBODIMENTS

Figure 1:
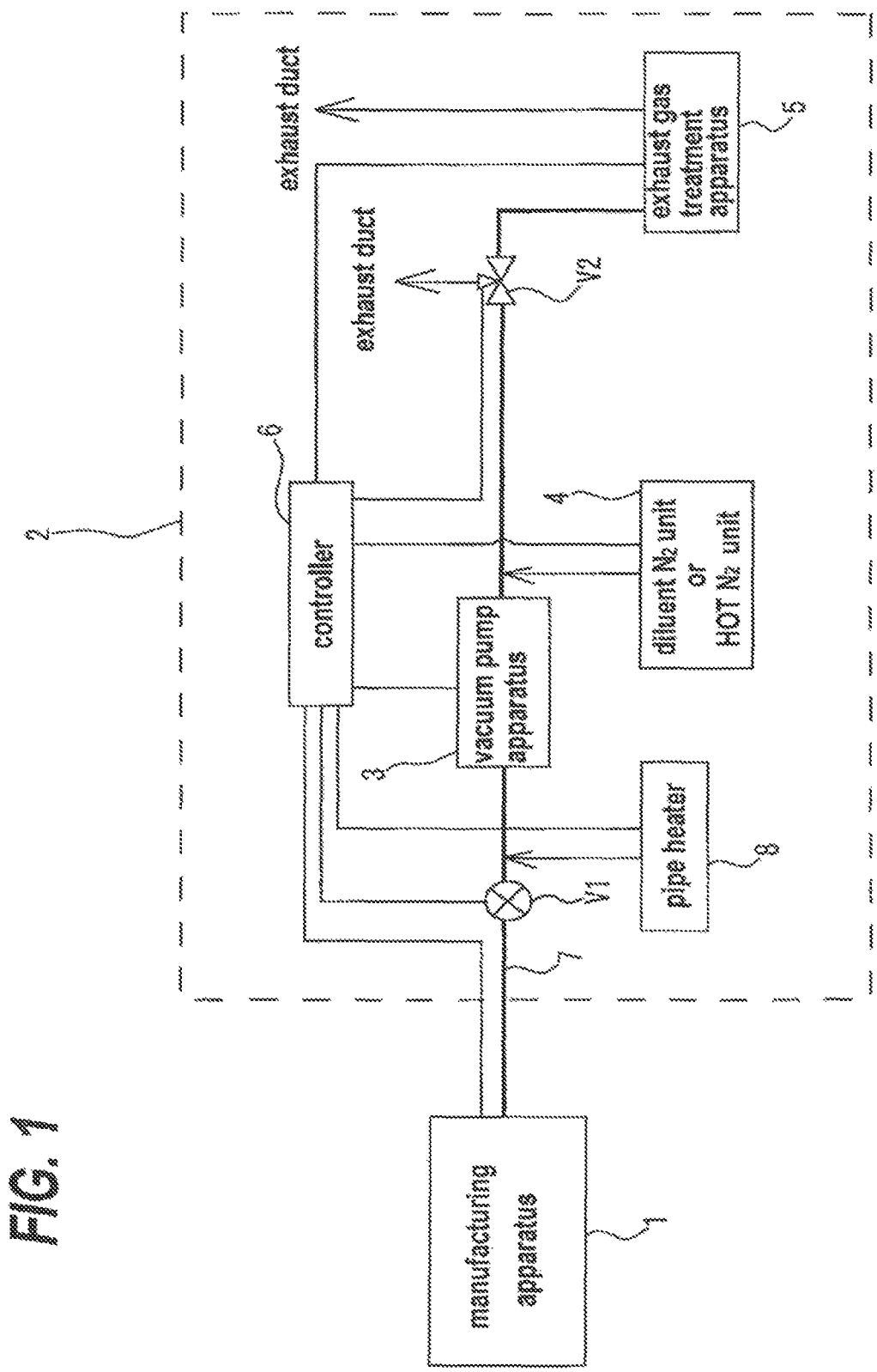
FIG. 1 is a schematic view showing a fundamental structure of an exhaust system according to the present invention.

An exhaust system according to embodiments of the present invention will be described in detail with reference to FIGS. 1 through 5. The same or corresponding members or elements having the same operation or function are denoted by the same reference numerals throughout views.

FIG. 1 is a schematic view showing a fundamental structure of the exhaust system according to the present invention. In FIG. 1, as an example of a manufacturing apparatus, a CVD apparatus in a semiconductor manufacturing apparatus will be described.

As shown in FIG. 1, the manufacturing apparatus 1 is connected to an exhaust system 2. The exhaust system 2 comprises a vacuum pump apparatus 3, a diluent $N_2$ unit 4, an exhaust gas treatment apparatus 5, a controller 6, and connecting pipes 7 for connecting the manufacturing apparatus 1, the vacuum pump apparatus 3 and the exhaust gas treatment apparatus 5. In the case where the manufacturing apparatus 1 is a CVD apparatus, operational sequence in a process chamber is as follows: wafer supply→vacuum drawing→temperature rise→film forming (material gas supply)→temperature fall→return to atmospheric pressure-→wafer removal. The above operational sequence is repeated. Further, in order to remove solid matters which have adhered to the interior of the chamber, a cleaning gas (e.g., HF, $ClF_3$, $NF_3$ or the like) is supplied periodically into the chamber, and the chamber is evacuated.

Further, in the connecting pipes 7 of the exhaust system 2, a pipe heater 8 is provided, and various valves such as a gate valve V1, a bypass valve V2 and the like are provided. Although an example in which the pipe heater 8 is provided at an upstream side of the vacuum pump apparatus 3 is shown in FIG. 1, the pipe heater 8 is provided also at a downstream side of the vacuum pump apparatus 3 (not shown). The exhaust system 2 may be configured to install all of the vacuum pump apparatus 3, the diluent $N_2$ unit 4, the exhaust gas treatment apparatus 5, the controller 6, the connecting pipes 7 and the pipe heater 8 in one housing, or may be configured to install each of these apparatuses individually. The exhaust gas treatment apparatus 5 is connected to an exhaust duct and the bypass valve 2 is also connected to the exhaust duct.

Next, the above apparatuses constituting the exhaust system will be described in detail.

Figure 2:
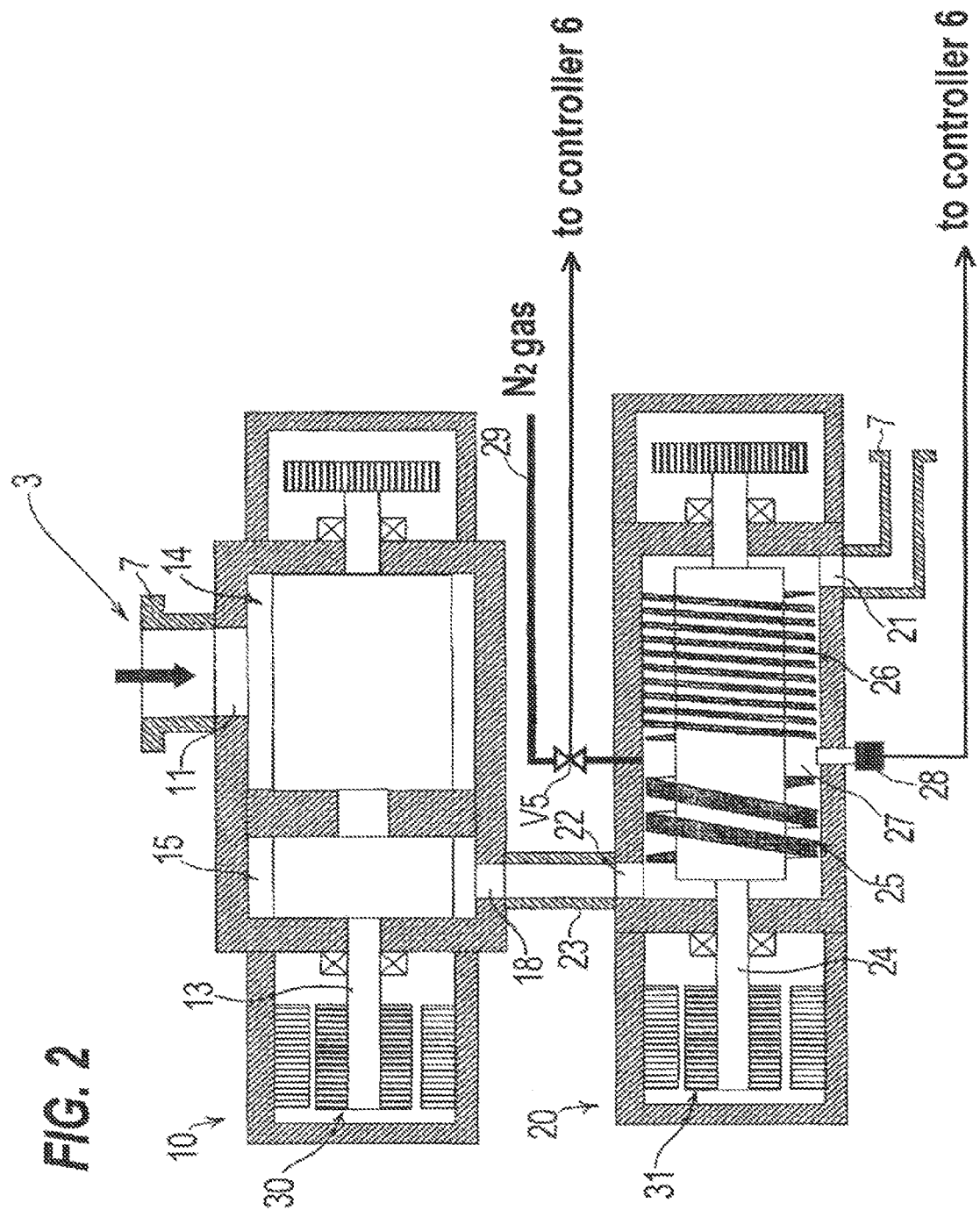
FIG. 2 is a schematic view showing one example of a vacuum pump apparatus provided at the uppermost stream side of the exhaust system.

FIG. 2 is a schematic view showing one example of the vacuum pump apparatus 3 provided at the uppermost stream side of the exhaust system 2. As shown in FIG. 2, the vacuum pump apparatus 3 is mainly composed of a first vacuum pump 10 having two compression stages and a second vacuum pump 20 having two compression stages. A pump suction port 11 is provided in the first vacuum pump 10 and a pump exhaust port 21 is provided in the second vacuum pump 20. An exhaust port 18 of the first vacuum pump 10 and a suction port 22 of the second vacuum pump 20 are connected to each other by a connecting pipe 23.

The first vacuum pump 10 comprises a Roots-type vacuum pump having a pair of Roots-type pump rotors 13 (only one pump rotor is shown in FIG. 2), and has two compression stages of a first-stage Roots part 14 and a second-stage Roots part 15 in a pump casing. The second vacuum pump 20 comprises a screw-type vacuum pump having a pair of screw-type pump rotors 24 (only one pump rotor is shown in FIG. 2), and has two compression stages of a first-stage screw part 25 and a second-stage screw part 26 in a pump casing. The first vacuum pump 10 includes a motor 30 for rotating the pair of Roots-type pump rotors 13. The second vacuum pump 20 includes a motor 31 for rotating the pair of screw-type pump rotors 24. The motors 30 and 31 comprise variable speed motors which are capable of speed control.

The connecting pipe 7 extending from the manufacturing apparatus 1 is connected to the pump sunction port 11 of the first vacuum pump 10. The connecting pipe 7 is connected to the pump exhaust port 21 of the second vacuum pump 20, so that a gas (e.g., a process gas) is exhausted to the exhaust gas treatment apparatus 5 through the connecting pipe 7. In this manner, the multistage vacuum pump apparatus in this example includes the first vacuum pump 10 and the second vacuum pump 20 which are connected to each other in series, and the second vacuum pump 20 is disposed downstream of the first vacuum pump 10. Specifically, the first vacuum pump 10 functions as a booster pump and is disposed at a higher vacuum side than the second vacuum pump 20. The second vacuum pump 20 functions as a main pump and is disposed closer to an atmospheric side than the first vacuum pump 10. The second vacuum pump 20 is configured such that it can be started under an atmospheric pressure.

At a suction side of the second-stage screw part 26 of the second vacuum pump 20 serving as the final compression stage, i.e., an interstage part 27 between the first-stage screw part 25 and the second-stage screw part 26 of the second vacuum pump 20, there is provided a pressure sensor 28 for measuring pressure inside the interstage part 27 (suction side of the final compression stage). Further, a pipe 29 for introducing N2 gas is connected to the interstage part 27 and a valve V5 is provided in the pipe 29. The pressure sensor 28 and the valve V5 are connected to the controller 6 by a signal line and/or a power line.

In the vacuum pump apparatus having the above a structure, because the second vacuum pump 20 located at a downstream side is closer to an atmospheric side than the first vacuum pump 10, internal pressure of the second vacuum pump 20 is higher than that of the first vacuum pump 10. Therefore, in the case of evacuating a condensable gas, a by-product of the condensable gas is likely to be deposited on the interior of the second vacuum pump 20, especially, on the second-stage screw part 26 serving as the final compression stage where pressure becomes highest. In the case of evacuating a corrosive gas, similarly, pressure and temperature become high at the second-stage screw part 26 of the final compression stage, and thus corrosive environment at the second-stage screw part 26 becomes severe.

Therefore, in the vacuum pump apparatus in this example, the pressure sensor 28 and the pipe 29 for introducing $N_2$ gas are provided at the interstage part 27 between the first-stage screw part 25 and the second-stage screw part 26 of the second vacuum pump 20 to measure the pressure of the interstage part 27 and to control an amount of the $N_2$ gas introduced to the interior of the pump from the $N_2$ gas introduction pipe 29 according to the measured pressure value. The $N_2$ gas introduction pipe 29 is connected to the diluent $N_2$ unit 4.

Figure 3:
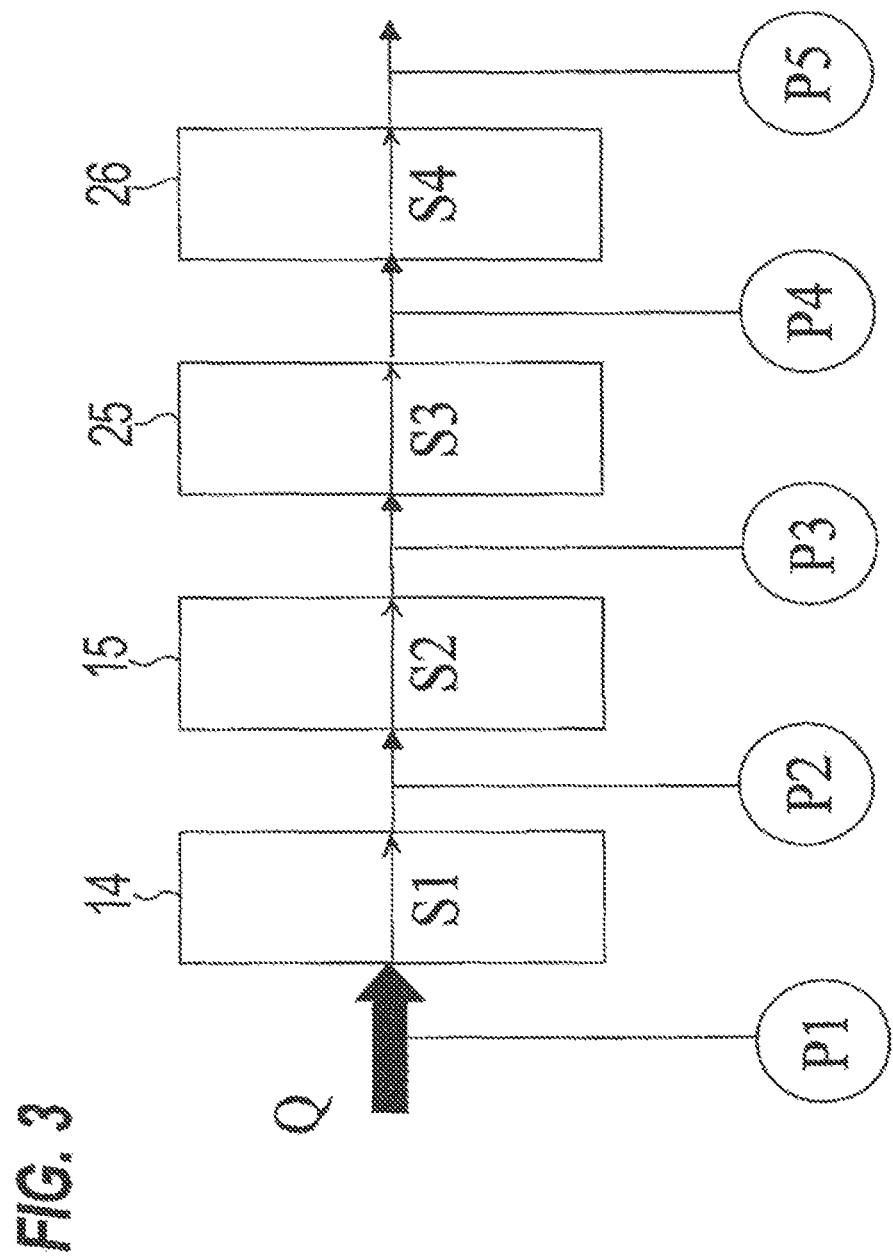
FIG. 3 is a view showing a relationship between exhaust velocity and pressure at the respective compression stages of a multistage vacuum pump shown in FIG. 1.

In this type of vacuum pump apparatus, as shown in FIG. 3, when a process gas Q is introduced into the interior of the pump and flows through the interior of the pump, from a viewpoint of reduction of power consumption, there is a relationship of S1>S2>S3>S4, where S1 is exhaust velocity at the first-stage Roots part 14, S2 is exhaust velocity S2 at the second-stage Roots part 15, S3 is exhaust velocity at the first-stage screw part 25, and S4 is exhaust velocity at the second-stage screw part 26.

On the condition that the exhaust velocity at the respective compression stages in an actual area of use is constant regardless of pressure, only the second-stage screw part 26 of the second vacuum pump 20 serving as the final compression stage can exert an effect of diluting the process gas such as a condensable gas, a corrosive gas or the like, i.e., an effect of reducing partial pressure of the process gas. This is because operating pressure of a compression stage other than the final compression stage is determined by pumping capacity of the subsequent compression stage located at the downstream side of the compression stage other than the final compression stage. Specifically, operating pressure of the first-stage Roots part 14 is determined by pumping capacity of the second-stage Roots part 15, operating pressure of the second-stage Roots part 15 is determined by pumping capacity of the first-stage screw part 25, and operating pressure of the first-stage screw part 25 is determined by pumping capacity of the second-stage screw part 26, respectively. Because the second-stage screw part (the final compression stage) 26 is exposed to atmospheric pressure at its downstream side, pressure rise due to introduction of $N_2$ gas to the interior of the pump is unlikely to occur. Thus, partial pressure of the process gas can be reduced at a rate of the $N_2$ gas introduced into the interior of the pump.

Further, as shown in FIG. 3, in the case where a certain amount of process gas Q is introduced into the interior of the pump and flows through the interior of the pump, there is a relationship of P1=Q/S1, P2=Q/S2, P3=Q/S3, P4=Q/S4, and P5=atmospheric pressure, where P1 is inlet pressure of the first-stage Roots part 14, P2 is inlet pressure of the second-stage Roots part 15, P3 is inlet pressure of the first-stage screw part 25, P4 is inlet pressure of the second-stage screw part 26, and P5 is outlet pressure of the second-stage screw part 26. As mentioned above, the exhaust velocity at the respective compression stages is set to S1>S2>S3>S4 from a viewpoint of reduction of power consumption, so that variation of the pressure value when the process gas Q flows through the interior of the pump becomes largest at the inlet pressure P4 of the second-stage screw part 26 of the second vacuum pump 20. Therefore, by measuring the inlet pressure P4 of the second-stage screw part 26 of the second vacuum pump 20 where variation of the pressure value inside the pump becomes largest, i.e., the pressure at the interstage part 27 between the first-stage screw part 25 and the second-stage screw part 26, whether the process gas is introduced from the pump suction port 11 to the interior of the pump or not can be judged.

According to the vacuum pump apparatus 3 shown in FIG. 2, the diluent $N_2$ gas is introduced from the diluent $N_2$ unit 4 into the interior of the pump through the suction side of the final compression stage so as to correspond to the flow rate of the process gas flowing inside the pump. Thus, without having a negative influence on pumping performance of the pump nor increasing running cost, attachment of solid matters to the final compression stage where the process gas is compressed and concentrated most inside the pump or occurrence of corrosion can be prevented.

The controller 6 (see FIG. 1) is configured to control the flow rate of $N_2$ gas supplied to the vacuum pump apparatus 3 based on the information of the operation process of the manufacturing apparatus 1 and the kind of gas and the flow rate of the gas supplied to the manufacturing apparatus 1. Further, the controller 6 is configured to control the flow rate of water or electric power supplied to the vacuum pump apparatus 3 based on the information of the operation process of the manufacturing apparatus 1 and the kind of gas and the flow rate of the gas supplied to the manufacturing apparatus 1.

In the vacuum pump apparatus 3 shown in FIG. 2, although the first vacuum pump 10 comprises the Roots-type vacuum pump and the second vacuum pump 10 comprises the screw-type vacuum pump, both the first vacuum pump 10 and the second vacuum pump 20 may comprise a Roots-type vacuum pump. The Roots-type vacuum pump includes a pair of pump rotors comprising three lobes of rotors, for example. In the case where the second vacuum pump 20 is a multistage Roots-type vacuum pump, the diluent $N_2$ gas should be introduced into the interior of the pump from the suction side of the final compression stage.

Figure 4:
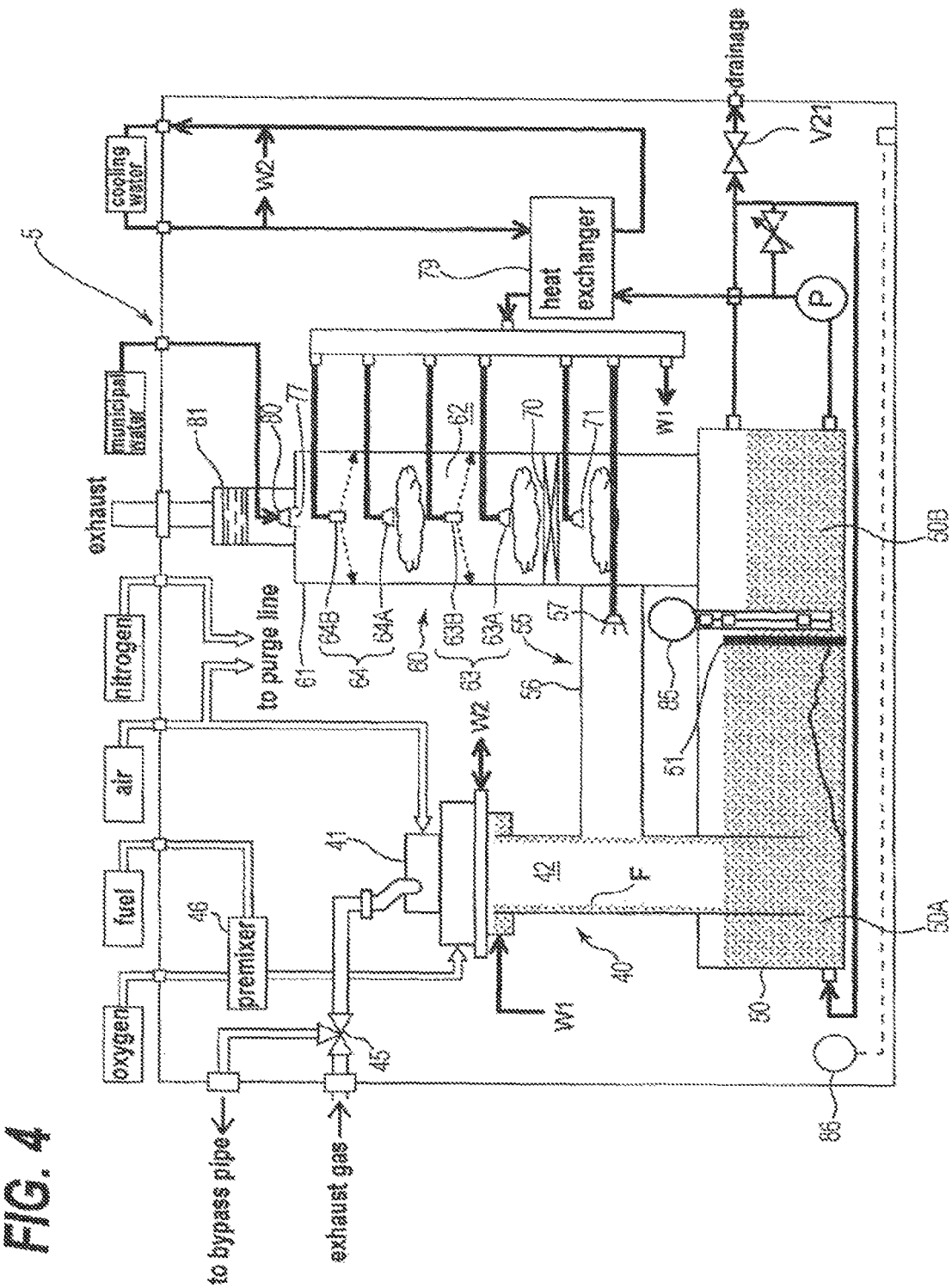
FIG. 4 is a schematic view showing an exhaust gas treatment apparatus disposed at the most downstream side of the exhaust system.

FIG. 4 is a schematic view showing an exhaust gas treatment apparatus 5 disposed at the most downstream side of the exhaust system 2. As shown in FIG. 4, the exhaust gas treatment apparatus 5 comprises a combustion-type heating treatment unit 40 for oxidatively decomposing an exhaust gas through combustion, and an exhaust gas cleaning unit 60 arranged at a stage subsequent to the heating treatment unit 40. The heating treatment unit 40 has a combustion chamber 42 for combusting the exhaust gas, and a burner 41 for generating flames swirling in the combustion chamber 42. The exhaust gas is supplied to the heating treatment unit 40 via a bypass valve (three-way valve) 45. If any problem is detected on the exhaust gas treatment apparatus, this bypass valve 45 is operated so that the exhaust gas is supplied to a bypass pipe (not shown) without being introduced into the exhaust gas treatment apparatus.

Fuel and oxygen are mixed in a premixer 46 in advance to form mixed fuel, and this mixed fuel is supplied to the burner 41. Further, air as an oxygen source for combusting (oxidizing) the exhaust gas is supplied to the burner 41. The burner 41 combusts the mixed fuel to form swirling flames in the combustion chamber 42, and the exhaust gas is combusted by the swirling flames. A UV sensor (not shown) is disposed inside the burner 41 and it is monitored by the UV sensor whether the swirling flames are formed normally. Air and nitrogen are supplied around the UV sensor as purge gas. Water W1 is supplied to the upper part of the combustion chamber 42. This water W1 flows down along the inner surface of the combustion chamber 42 and a water film F is formed on the inner surface of the combustion chamber 42. The combustion chamber 42 is protected from heat of the swirling flames by the water film F. Further, a cooling water passage (not shown) through which cooling water W2 for cooling the burner 41 flows is provided between the burner 41 and the combustion chamber 42.

The exhaust gas introduced into the combustion chamber 42 through the burner 41 is combusted by the swirling flames. Thus, combustible gases such as silane, disilane and the like contained in the exhaust gas is oxidatively decomposed. At this time, by combustion of the combustible gases, silica ($SiO_2$) is produced as a by-product. This silica exists in the exhaust gas as fine dust.

A part of such a by-product is accumulated on the inner surface of the burner 41 or the combustion chamber 42. Therefore, the heating treatment unit 40 is configured to operate a scraper (not shown) periodically so that the by-product accumulated on the burner 41 or the inner surface of the combustion chamber 42 is scraped off. A circulation tank 50 is disposed below the combustion chamber 42. A weir 51 is provided inside the circulation tank 50, and the circulation tank 50 is partitioned into a first tank 50A at an upstream side and a second tank 50B at a downstream side. The by-product scraped off by the scraper is accumulated on the bottom of the first tank 50A. Further, the water film F which have flowed down along the inner surface of the combustion chamber 42 flows into the first tank 50A. The water in the first tank 50A flows over the weir 51 and flows into the second tank 50B.

The combustion chamber 42 communicates with an exhaust gas cleaning unit 60 through a cooling unit 55. This cooling unit 55 has a piping 56 extending toward the combustion chamber 42 and a spray nozzle 57 arranged in the piping 56. The spray nozzle 57 sprays water countercurrently into the exhaust gas flowing in the piping 56. Therefore, the exhaust gas treated by the heating treatment unit 40 is cooled by water sprayed from the spray nozzle 57. Water is recovered to the circulation tank 50 through the piping 56.

The cooled exhaust gas is then introduced into the exhaust gas cleaning unit 60. This exhaust gas cleaning unit 60 is an apparatus for cleaning the exhaust gas with water and removing fine dust contained in the exhaust gas. This dust is mainly composed of a by-product produced by oxidative decomposition (combustion treatment) in the heating treatment unit 40.

The exhaust gas cleaning unit 60 comprises a wall member 61 for forming a gas passage 62, and a first mist nozzle 63A, a first water film nozzle 63B, a second mist nozzle 64A and a second water film nozzle 64B disposed in the gas passage 62. These mist nozzles 63A and 64A and water film nozzles 63B and 64B are located at the central portion of the gas passage 62, and are arranged substantially linearly. The first mist nozzle 63A and the first water film nozzle 63B constitute a first nozzle unit 63, and the second mist nozzle 64A and the second water film nozzle 64B constitute a second nozzle unit 64. Therefore, in this embodiment, two sets of nozzle units 63 and 64 are provided. One set of nozzle units or three or more sets of nozzle units may be provided.

The first mist nozzle 63A is disposed further upstream in a flowing direction of an exhaust gas than the first water film nozzle 63B. Similarly, the second mist nozzle 64A is disposed further upstream than the second water film nozzle 64B. Specifically, the mist nozzle and the water film nozzle are alternately disposed. The mist nozzles 63A and 64A, the water film nozzles 63B and 64B, and the wall member 61 are composed of corrosion-resistant resin (e.g., PVC: polyvinyl chloride).

Structures and sizes of the first mist nozzle 63A and the second mist nozzle 64A are identical to each other, and structures and sizes of the first water film nozzle 63B and the second water film nozzle 64B are identical to each other.

A flow control member 70 for regulating flow of an exhaust gas is disposed at an upstream side of the first mist nozzle 63A. This flow control member 70 causes pressure loss of the exhaust gas and uniformizes the flow of the exhaust gas in the gas passage 62. It is preferable that the flow control member 70 is composed of a material other than metal in order to prevent acid corrosion. As an example of the flow control member 70, there is a nonwoven material made of resin or a resin plate having a plurality of openings. A mist nozzle 71 is disposed at an upstream side of the flow control member 70. The mist nozzles 63A, 64A and 71 and the water film nozzles 63B and 64B are attached to the wall member 61.

As shown in FIG. 4, the exhaust gas is introduced into the interior of the exhaust gas cleaning unit 60 from the piping 56 provided at a lower portion of the exhaust gas cleaning unit 60. The exhaust gas flows from the lower part to the upper part in the exhaust gas cleaning unit 60. More specifically, the exhaust gas introduced from the piping 56 is first directed toward the mist nozzle 71 of the exhaust gas cleaning unit 60. Then, the exhaust gas passes through the mist formed by the mist nozzle 71 and the flow of the exhaust gas is regulated by the flow control member 70. The exhaust gas which has passed through the flow control member 70 forms a uniform flow and moves upwards through the gas passage 62 at low speed. Mist, water film, mist and water film are formed in the gas passage 62 in that order.

Fine dust having a diameter of less than 1 μm contained in the exhaust gas easily adheres to water particles forming mist by diffusion action (Brownian movement), and thus the fine dust is trapped by the mist. Dust having a diameter of not less than 1 μm is mostly trapped by the water particles in the same manner. Since a diameter of the water particles is approximately 100 μm, the size (diameter) of the dust adhering to these water particles becomes large apparently. Therefore, the water particles containing dust easily hit the water film at the downstream side due to inertial impaction, and the dust is thus removed from the exhaust gas together with the water particles. Dust having a relatively large diameter which has not been trapped by the mist is also trapped by the water film in the same manner and is removed. In this manner, the exhaust gas is cleaned by water and the cleaned exhaust gas is discharged from a discharge port 77 provided at an upper end portion of the wall member 61.

It has been known that the inertial impaction against the water film is unlikely to occur in the case of dust having a diameter of less than 1 μm. According to the present embodiment, since the dust having a diameter of less than 1 μm easily tends to adhere to the water particles by diffusion action (Brownian movement), fine dust is mostly trapped by the water particles. The water particles which have captured the dust have a larger diameter than 1 μm, and thus the inertial impaction against the water film easily tends to occur. Therefore, the water particles are easily captured by the water film.

It is preferable that flow velocity of the exhaust gas flowing through the gas passage 62 is low. This is because low flow velocity of the exhaust gas allows duration of contact between the dust contained in the exhaust gas and the mist to be longer and consequently dust removal efficiency is increased. From such viewpoints, it is preferable that a cross-sectional area of the gas passage 62 is large. In the gas passage 62, the water film is formed above the mist. Therefore, the water film plays a role of a protective film or an umbrella for the mist and protects the mist from water droplets falling from the upper side. As a result, collapse of the mist caused by the water droplets is prevented and the dust removal efficiency is increased.

As shown in FIG. 4, the above-mentioned circulation tank 50 is disposed below the exhaust gas cleaning unit 60. Water supplied from the mist nozzles 63A, 64A and 71 and the water film nozzles 63B and 64B is recovered into the second tank 50B of the circulation tank 50. The water stored in the second tank 50B is supplied to the mist nozzles 63A, 64A and 71 and the water film nozzles 63B and 64B by a circulation pump P. A heat exchanger 79 is disposed between the circulation pump P and the exhaust gas cleaning unit 60. In this heat exchanger 79, heat exchange is performed between cooling water and circulating water (water from the circulation tank 50) and the circulating water is cooled. The cooled circulating water is supplied to the mist nozzles and the water film nozzles. At the same time, the circulating water is supplied to an upper portion of the combustion chamber 42 of the heating treatment unit 40 as water W1, and as described above, the water film F is formed on an inner surface of the combustion chamber 42.

As described above, water to be supplied to the mist nozzles 63A and 64A and the water film nozzles 63B and 64B is water recovered by the circulation tank 50 and contains dust (such as a by-product). Therefore, in order to clean the gas passage 62, municipal water is supplied to the gas passage 62 from a shower nozzle 80 disposed above the discharge port 77. A mist trap 81 is provided above the shower nozzle 80. This mist trap 81 has a plurality of baffle plates therein and serves to trap the mist having passed through the discharge port 77. In this manner, the treated and detoxified exhaust gas is finally released into the atmosphere through the exhaust duct (see FIG. 1).

A liquid level sensor 85 is provided in the circulation tank 50. This liquid level sensor 85 monitors liquid level of the second tank 50B, and when the liquid level of the second tank 50B exceeds a predetermined level, a valve V21 is opened to discharge water in the second tank 50B. Further, a part of water pumped by the circulation pump P flows into the first tank 50A from a side portion of the circulation tank 50. The flowing water washes out by-products which have accumulated on the bottom of the first tank 50A toward the weir 51. Thus, the lower end opening of the combustion chamber 42 is prevented from being blocked by the by-products. A leakage sensor 86 is disposed below the circulation tank 50 to monitor water leakage from the circulation tank 50.

According to the exhaust gas treatment apparatus 5 shown in FIG. 4, fine dust contained in the exhaust gas easily adheres to mist by diffusion action (Brownian movement), and this mist is removed from the exhaust gas due to contact (inertial impaction) with the water film. Specifically, since the fine dust is trapped by the mist, the size of the dust becomes large apparently. Therefore, the dust can be easily brought into contact with the water film formed by the water film nozzle. As a result, the fine dust can be removed from the exhaust gas with high efficiency.

Figure 5:
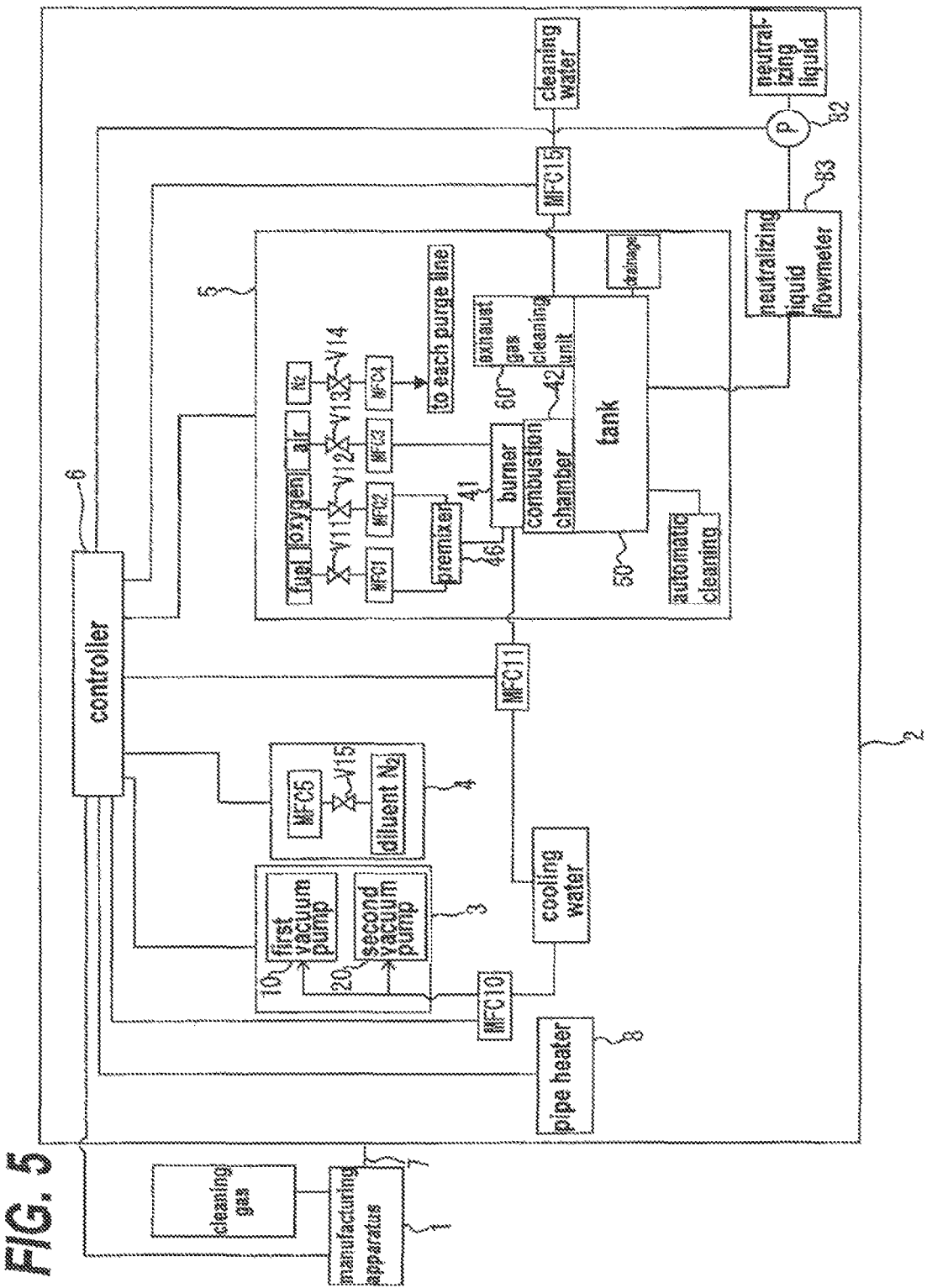
FIG. 5 is a schematic view for explaining input and output of information performed between the manufacturing apparatus and a controller of the exhaust system and various control methods performed between the controller and the vacuum pump apparatus, the diluent $N_2$ unit, the exhaust gas treatment apparatus and the pipe heater.

FIG. 5 is a schematic view for explaining input and output of information performed between the manufacturing apparatus 1 and the controller 6 of the exhaust system 2 and various control methods performed between the controller 6, and the vacuum pump apparatus 3, the diluent $N_2$ unit 4, the exhaust gas treatment apparatus 5 and the pipe heater 8. In FIG. 5, although the controller 6 is shown as a controller for controlling all the apparatuses of the exhaust system 2, the controller 6 may be an individual controller attached to each apparatus (the vacuum pump apparatus 3, the diluent $N_2$ unit 4, the exhaust gas treatment apparatus 5 and the pipe heater 8).

In the exhaust system shown in FIG. 5, operation process of the manufacturing apparatus 1, the kind of supply gas and the flow rate of supply gas are inputted into the controller 6 from the manufacturing apparatus 1. In the case where the manufacturing apparatus 1 is a CVD apparatus, operational sequence in the process chamber is as follows: wafer supply→vacuum drawing→temperature rise→film forming (material gas supply)→temperature fall→return to atmospheric pressure→wafer removal. The above operational sequence is repeated. Further, in order to remove solid matters which have adhered to the interior of the chamber, a cleaning gas (e.g., HF, $ClF_3$, $NF_3$ or the like) is supplied periodically into the chamber, and the chamber is evacuated. The controller 6 is configured to perform automatic control of rotational speeds of the first vacuum pump 10 and the second vacuum pump 20 in the vacuum pump apparatus 3 according to the operation process of the manufacturing apparatus 1, the kind of supply gas and the flow rate of supply gas. Specifically, the first vacuum pump 10 disposed at the vacuum side and serving as a booster pump and the second vacuum pump 20 disposed at the atmospheric side and serving as a main pump are controlled to operate at the optimal rotational speeds according to the operation process of the manufacturing apparatus 1, the kind of supply gas and the flow rate of supply gas.

In the case where the manufacturing apparatus 1 is a CVD apparatus, the optimum rotational speeds of the first vacuum pump 10 and the second vacuum pump 20 are as follows:
1) Wafer supply: Although the vacuum pumps are not required to operate, if operation of the vacuum pumps is completely stopped, a long rise time is required. Therefore, the vacuum pumps are operated at a lowered output, for example, 20% output, and vacuum evacuation of the chamber is stopped by the valve.
2) Vacuum drawing: The vacuum pumps are operated at 100% output.
3) Temperature rise: Because it is sufficient to keep vacuum, the vacuum pumps are operated at 70% output, for example.
4) Film forming: Because material gas is supplied, the vacuum pumps are operated at 100% output.
5) Temperature fall: Because inflow of the gas is stopped, it is sufficient for the vacuum pumps to operate at a slightly lowered output. Therefore, the vacuum pumps are operated at 70% output, for example.
6) Return to atmospheric pressure: $N_2$ gas is supplied to the chamber to prevent oxidization. Although the vacuum pumps are not required to operate, the vacuum pumps may be operated at a lowered output for the same reason as 1).
7) Wafer removal: The same as 1).

In the vacuum drawing process of the vacuum pump apparatus 3, because no gas is supplied to the chamber, operation process of the vacuum drawing is inputted from the manufacturing apparatus 1 into the controller 6, and information of no gas supply and zero flow rate of supply gas is inputted into the controller 6. Then, when a gas is supplied to the chamber, information of operation process, the kind of supply gas and the flow rate of supply gas is inputted from the manufacturing apparatus 1 into the controller 6. In the process of supplying the gas to the chamber, the controller 6 performs automatic control of rotational speeds of the first vacuum pump 10 and the second vacuum pump 20 in the vacuum pump apparatus 3 according to the kind of supply gas and the flow rate of supply gas. Thus, the first vacuum pump 10 and the second vacuum pump 20 can be operated at the optimal pumping capabilities in response to the kind of supply gas and the flow rate of supply gas in the chamber. Therefore, power consumption in the vacuum pump apparatus 3 can be reduced and energy-saving can be achieved. In place of the controller 6, information from the manufacturing apparatus 1 may be inputted into a controller for controlling the vacuum pump apparatus 3 individually to control rotational speeds of the vacuum pump apparatus 3.

Further, the controller 6 sets controlled-temperature of the pipe heater 8 automatically according to operation process of the manufacturing apparatus 1, the kind of supply gas and the flow rate of supply gas, and controls the pipe heater 8 automatically to keep the pipe heater 8 at the set temperature. In this case, heating temperature corresponding to the kind of supply gas and the flow rate of supply gas is stored in advance in the controller 6, and change of temperature setting of the pipe heater 8 and temperature control of the pipe heater 8 are automatically performed by a combination of feedforward control and PID control. Further, processes that do not need to be heated are stored in advance in the controller 6, and the controller 6 turns the pipe heater 8 off automatically in the processes that do not need to be heated. In this manner, the controller 6 can turn the pipe heater 8 on or off at the right time, and can control the pipe heater 8 at an optimal temperature according to operation process of the manufacturing apparatus 1, the kind of supply gas and the flow rate of supply gas. Thus, power consumption in the pipe heater 8 can be reduced and energy-saving can be achieved. Further, simultaneously, blocking of the pipe or stopping of the vacuum pump caused by accumulation of powder in the connecting pipe 7 or in the apparatuses such as the vacuum pump apparatus 3 or the like can be prevented. In place of the controller 6, information from the manufacturing apparatus 1 may be inputted into a controller for controlling the pipe heater 8 individually to control the pipe heater 8.

In the exhaust gas treatment apparatus 5, mass flow controllers MFC1, MFC2 and MFC3 are provided in respective pipes for fuel, oxygen and air, and supply quantities of fuel, oxygen and air to the burner 41 can be automatically regulated. Further, shut-off valves V11, V12 and V13 are provided in respective pipes for fuel, oxygen and air, and supply of fuel, oxygen and air to the burner 41 can be stopped in the manufacturing processes of the manufacturing apparatus 1 that do not need exhaust gas treatment. Further, a mass flow controller MFC4 and a shut-off valve V14 are provided in the $N_2$ gas pipe.

Supply quantities of fuel, oxygen and air corresponding to the operation process of the manufacturing apparatus, the kind of supply gas and the flow rate of supply gas are stored in advance in the controller 6, and the controller 6 controls the mass flow controllers MFC1, MFC2 and MFC3 automatically by a combination of feedforward control and PID control. Specifically, the quantity of heat required for exhaust gas treatment is automatically calculated from the kind of gas supplied to the manufacturing apparatus, the flow rate of gas supplied to the manufacturing apparatus, the flow rate of $N_2$ supplied to the vacuum pump apparatus 3, and the flow rate of the diluent $N_2$ supplied from the diluent $N_2$ unit 4, and supply quantities of fuel, oxygen and air are automatically calculated in the controller 6. Then, supply quantities of fuel, oxygen and air are automatically regulated by the mass flow controllers MFC1, MFC2 and MFC3. Further, in the manufacturing processes of the manufacturing apparatus that do not need exhaust gas treatment, the shut-off valves V11, V12 and V13 are operated to stop supply of fuel, oxygen and air. Thus, power consumption in the exhaust gas treatment apparatus 5 can be reduced and supply quantities of fuel, oxygen and air can be reduced, and energy-saving can be achieved. In place of the controller 6, information from the manufacturing apparatus 1 may be inputted into a controller for controlling the exhaust gas treatment apparatus 5 individually to control the exhaust gas treatment apparatus 5. In the case where the exhaust gas treatment apparatus 5 is not a combustion-type apparatus but a plasma-type apparatus or a heater-type apparatus, temperature required for the exhaust gas treatment is stored in advance in the controller 6, and plasma output or heater output is automatically controlled by a combination of feedforward control and PID control.

Further, as shown in FIG. 5, in the diluent $N_2$ unit 4, a mass flow controller MFC5 is provided in the diluent $N_2$ pipe. Further, a shut-off valve V15 is provided in the diluent $N_2$ pipe, and supply of the diluent $N_2$ can be stopped in the processes of the manufacturing apparatus that do not need dilution of $N_2$. The flow rate of the diluent $N_2$ corresponding to the operation process of the manufacturing apparatus, the kind of supply gas and the flow rate of supply gas is stored in advance in the controller 6, and the controller 6 controls the mass flow controller MFC5 automatically by a combination of feedforward control and PID control. A plurality of diluent $N_2$ pipes which allow the diluent $N_2$ to flow at different flow rates may be prepared, and the diluent $N_2$ pipes may be automatically switched over by valves to control the flow rate of the diluent $N_2$. By the structure shown in FIG. 5, supply quantities of the diluent $N_2$ can be reduced and energy-saving can be achieved. Further, because appropriate quantities of the diluent $N_2$ can be supplied to the vacuum pump apparatus 3 and the connecting pipe 7, the vacuum pump can be operated stably and explosion and ignition of the combustible gases can be prevented. The diluent $N_2$ supplied from the diluent $N_2$ unit 4 may be HOT $N_2$. In place of the controller 6, information from the manufacturing apparatus 1 may be inputted into a controller for controlling the diluent $N_2$ unit 4 individually to control the diluent $N_2$ unit 4.

As shown in FIG. 5, cooling water can be supplied to the first vacuum pump 10 and the second vacuum pump 20 of the vacuum pump apparatus 3 to cool the first vacuum pump 10 and the second vacuum pump 20. Further, cooling water can be supplied to the burner 41 and the heat exchanger 79 (see FIG. 4) of the exhaust gas treatment apparatus 5 to cool the burner 41 and the heat exchanger 79. Mass flow controllers MFC10, MFC11 and the like are provided in pipes for cooling water in the first vacuum pump 10, the second vacuum pump 20 and the exhaust gas treatment apparatus 5. Amounts of cooling water to be used corresponding to the operation process of the manufacturing apparatus, the kind of supply gas and the flow rate of supply gas are stored in advance in the controller 6, and the controller 6 controls the mass flow controllers MFC10, MFC11 and the like automatically by a combination of feedforward control and PID control. A plurality of cooling water pipes which allow the cooling water to flow at different flow rates may be prepared, and the cooling water pipes may be automatically switched over by valves to control the flow rate of the cooling water. By the structure shown in FIG. 5, supply quantities of the cooling water in the vacuum pump apparatus 3 and the exhaust gas treatment apparatus 5 can be reduced and energy-saving can be achieved.

Further, as shown in FIG. 5, cleaning water can be supplied to an exhaust gas cleaning unit 60 of the exhaust gas treatment apparatus 5. A mass flow controller MFC15 is provided in a pipe for the cleaning water. An amount of cleaning water to be used corresponding to the operation process of the manufacturing apparatus, the kind of supply gas and the flow rate of supply gas is stored in advance in the controller 6, and the controller 6 controls the mass flow controller MFC15 automatically by a combination of feedforward control and PID control. A plurality of cleaning water pipes which allow the cleaning water to flow at different flow rates may be prepared, and the cleaning water pipes may be automatically switched over by valves to control the flow rate of the cleaning water. By the structure shown in FIG. 5, an amount of the cleaning water in the exhaust gas treatment apparatus 5 can be reduced and energy-saving can be achieved.

As shown in FIG. 5, in order to neutralize drainage of the exhaust gas treatment apparatus 5, a neutralizing liquid supply pump 82 is provided in a pipe connected to the circulation tank 50. A neutralizing liquid flowmeter 83 is provided in the pipe of the neutralizing liquid supply pump 82. The controller 6 automatically calculates a supply quantity of the neutralizing liquid for neutralizing drainage according to the kind of supply gas and the flow rate of supply gas in the manufacturing apparatus, and output of the neutralizing liquid supply pump 82 is automatically adjusted so that the flow rate of the neutralizing liquid becomes equal to the calculation value. By the structure shown in FIG. 5, the supply quantity of the neutralizing liquid can be reduced and pH control can be performed without a pH meter.

Further, as shown in FIG. 5, when the exhaust system 2 becomes cleaning timing, a cleaning gas is evacuated from the manufacturing apparatus 1 to remove powder which has adhered to gas contacting portions of the exhaust system 2. Specifically, by detecting a predetermined amount of powder which has adhered to the vacuum pump apparatus 3, the exhaust gas treatment apparatus 5 and the connecting pipe 7, a signal indicative of occurrence of powder adhesion is outputted to the manufacturing apparatus 1 as maintenance request from these apparatuses in the exhaust system 2. This output may be performed from a controller for controlling each apparatus of the exhaust system 2 individually or the controller 6. The manufacturing apparatus 1 which has received the signal releases a cleaning gas such as HF, ClF$_3$, or NF$_3$ to the outlet of the manufacturing apparatus. The powder adhesion in the exhaust system 2 is detected from pressure (exhaust pressure of the vacuum pump, inlet pressure of the exhaust gas treatment apparatus or the like), a load factor of the vacuum pump (electric power or the like), emission time of the gas from the manufacturing apparatus, or the like. Thus, blocking of the pipe or stopping of the vacuum pump caused by the powder can be prevented, and the time for cleaning the powder can be shortened.

Because the cleaning gas such as HF, ClF$_3$, NF$_3$ or the like is a strongly corrosive gas, when pipes or apparatuses of the exhaust system 2 are cleaned by the cleaning gas, there is a possibility that the vacuum pump apparatus 3, the exhaust gas treatment apparatus 5, the connecting pipe 7 and the like are corroded. Therefore, heating temperature corresponding to the kind of the cleaning gas and the flow rate of the cleaning gas is stored in advance in the controller 6, and change of temperature setting of the pipe heater 8 and the diluent N$_2$ unit 4 and temperature control of the pipe heater 8 and the diluent N$_2$ unit 4 are automatically performed by a combination of feedforward control and PID control. Thus, corrosion wear in each apparatus of the exhaust system 2 caused by the cleaning gas can be prevented. In place of the controller 6, the pipe heater 8 and the diluent N$_2$ unit 4 may be controlled by a controller for controlling the pipe heater 8 and the diluent N$_2$ unit 4 individually.

In the exhaust system 2 shown in FIG. 5, when maintenance is required in the exhaust system 2, the controller 6 can output maintenance request to the manufacturing apparatus 1. Further, the controller 6 calculates the time requiring maintenance in the exhaust system 2 and outputs the calculation result to the manufacturing apparatus 1. Specifically, the operation process of the manufacturing apparatus, the kind of supply gas and the flow rate of supply gas are inputted into the controller 6 from the manufacturing apparatus 1. The controller 6 calculates an accumulated supply quantity of the gas supplied to the manufacturing apparatus 1 by adding the flow rate of the supply gas inputted into the controller 6, and when the accumulated supply quantity requiring maintenance in the apparatuses of the exhaust system 2 is reached, the controller 6 outputs maintenance request to the manufacturing apparatus 1. In this case, typical apparatuses requiring maintenance are the vacuum pump apparatus 3 to which powder adheres and the exhaust gas treatment apparatus 5 in which powder and drainage are accumulated. Needless to say, other apparatuses may require maintenance. In this manner, because the maintenance request can be issued from the exhaust system 2 to the manufacturing apparatus 1, appropriate maintenance and cleaning of the apparatuses of the exhaust system 2 can be carried out. Therefore, equipment failure in the exhaust system 2 can be prevented, and stable operation of the manufacturing apparatus 1 can be ensured. Before the accumulated supply quantity is reached, the controller 6 can output the kind of gas and an available supply quantity (gas quantity continuously treatable in the exhaust system 2) of such gas based on the kind of supply gas and the quantity of supply gas inputted from the manufacturing apparatus 1, predict the time requiring maintenance from these information and output the prediction information to the manufacturing apparatus 1. In the exhaust gas treatment apparatus 5, powder is accumulated in the circulation tank 50. Because the amount of powder accumulated in the circulation tank 50 is proportional to the amount of exhaust gas discharged from the manufacturing apparatus 1, the time requiring maintenance in the exhaust system 2 can be detected by calculating the amount of powder accumulated in the circulation tank 50 from the amount of exhaust gas discharged from the manufacturing apparatus 1.

Further, in the exhaust system 2 shown in FIG. 5, automatic cleaning of powder in the exhaust gas treatment apparatus 5 can be performed. After the controller 6 confirms the process where the manufacturing apparatus 1 produces no product, automatic cleaning of the tank and the powder collecting trap in the exhaust gas treatment apparatus 5 is performed. The automatic cleaning is performed only in the case where the kind of supply gas in the manufacturing apparatus is specified and the accumulated supply quantity of the specified gas reaches a predetermined value. Thus, maintenance work by manpower can be reduced, and operating rate of the manufacturing apparatus 1 can be improved. Further, utility used in the maintenance can be reduced.

Further, an automatic valve is provided in the connecting pipe 7 of the respective apparatuses in the exhaust system 2 so that air-tight test part can be sealed, and a pressure sensor and an N$_2$ supply pipe are provided in the sealed part. When a button (switch) for automatic air-tight test is operated on a control panel of each apparatus in the exhaust system 2, the part under air-tight test is sealed by the automatic valves, and the sealed part is automatically pressurized to a predetermined pressure by N$_2$. A pressure when the sealed part has been pressurized by N$_2$ is stored, and presence or absence of leakage portion is automatically judged on a software in the control panel by comparing the stored pressure and a pressure after the elapse of a predetermined time. After completing the air-tight test, the automatic valves are opened sequentially to release N$_2$ which has been used for pressurization.

In the exhaust system 2 shown in FIG. 5, when abnormality or failure of the apparatuses in the exhaust system 2 occurs, display signals or alarm signals indicative of abnormality or failure can be outputted from the apparatuses of the exhaust system 2 to the manufacturing apparatus 1 in the same manner as the conventional exhaust system.

Figure 6:
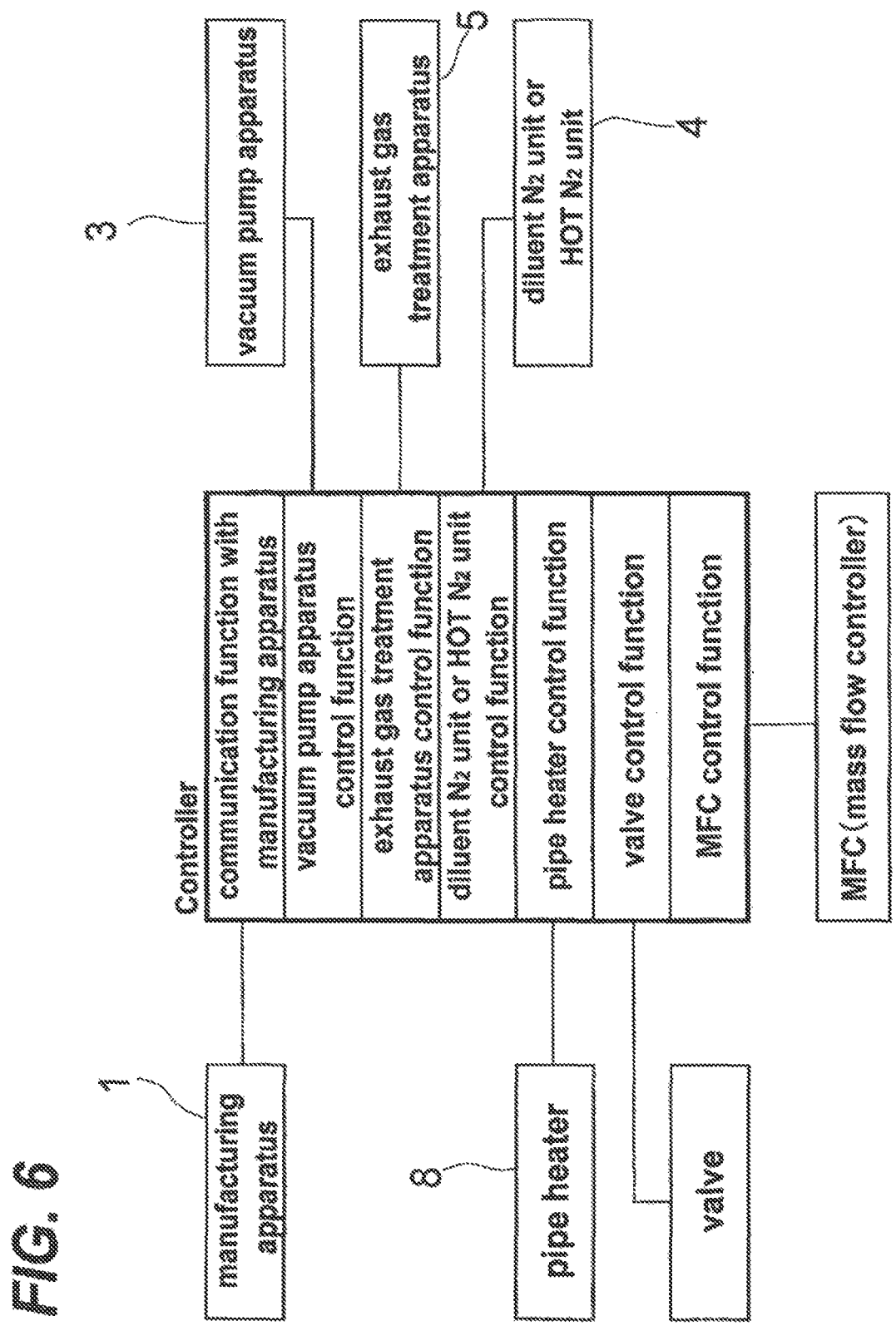
FIG. 6 is a schematic view showing an example of a controller having communication function with the manufacturing apparatus and operation control function of apparatuses in the exhaust system provided at the exhaust side of the manufacturing apparatus.
Figure 7:
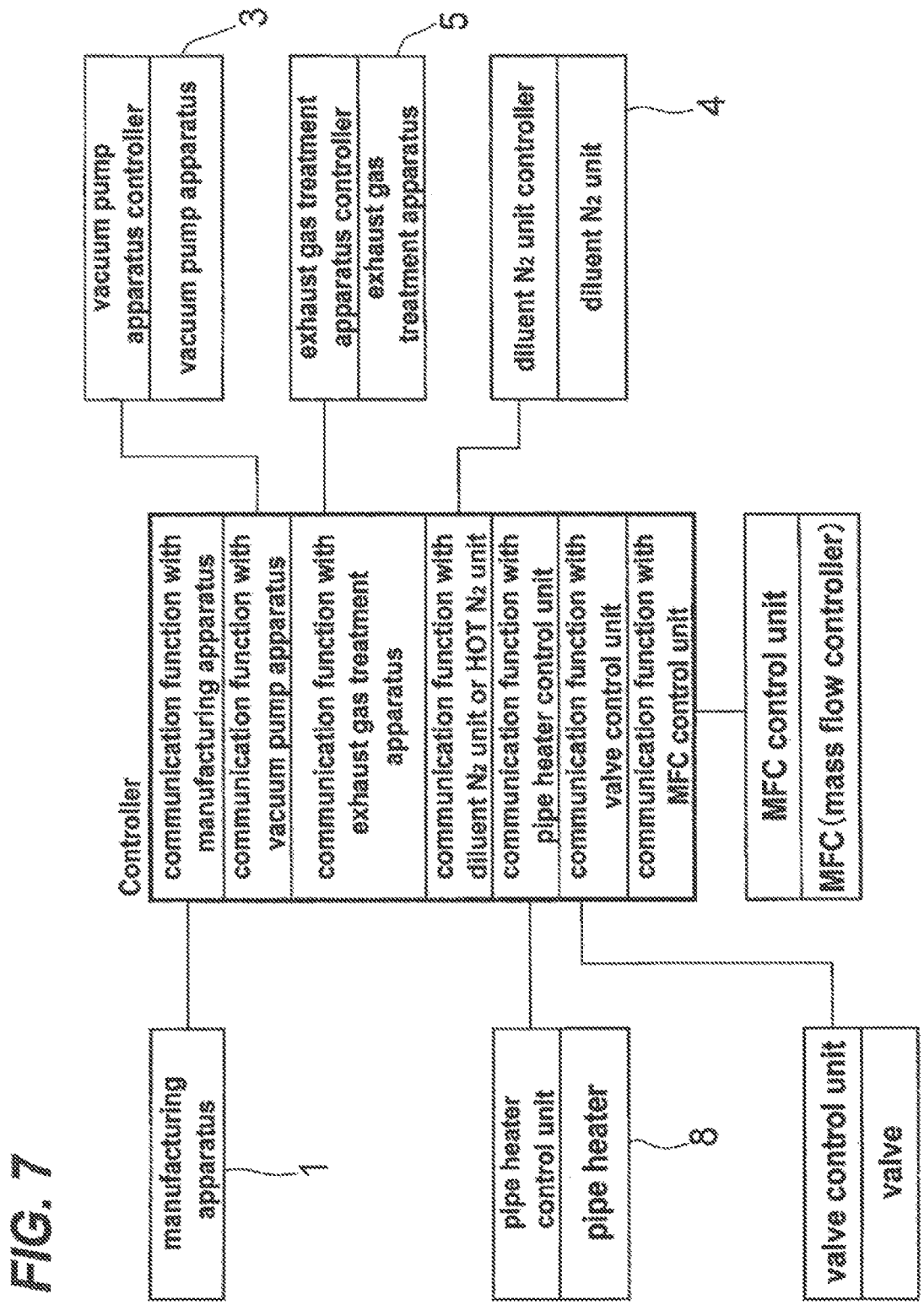
FIG. 7 is a schematic view showing an example of a controller having communication function with the manufacturing apparatus and communication function with a control unit (or a controller attached to each apparatus) of each apparatus in the exhaust system.
Figure 8:
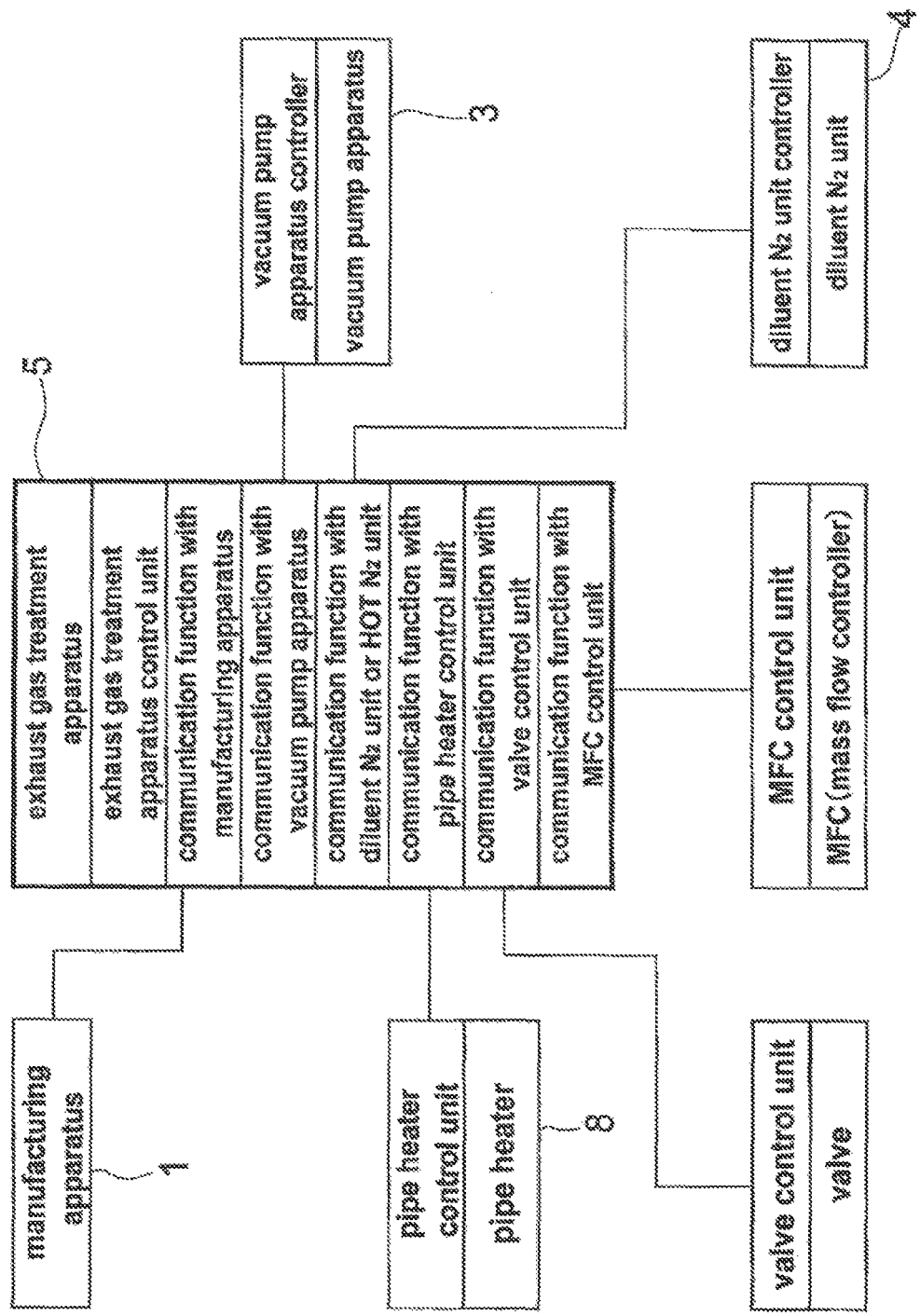
FIG. 8 is a schematic view showing an example in which communication function with the manufacturing apparatus and communication function with each apparatus in the exhaust system are provided in a control unit attached to each apparatus in the exhaust system.

FIGS. 6 to 8 are schematic views showing embodiments of a controller for controlling all the apparatuses of the exhaust system 2, and an individual controller attached to each apparatus (the vacuum pump apparatus 3, the diluent N$_2$ unit 4, the exhaust gas treatment apparatus 5, and pipe heater 8) in the exhaust system 2.

FIG. 6 shows an example of a controller having communication function with the manufacturing apparatus and operation control function of apparatuses (all or part) in the exhaust system provided at the exhaust side of the manufacturing apparatus. As shown in FIG. 6, the controller performs communication with the manufacturing apparatus 1 and operation control of each apparatus (the vacuum pump apparatus 3, the diluent N$_2$ unit 4, the exhaust gas treatment apparatus 5, the pipe heater 8, valves and the like) provided in the exhaust system 2.

FIG. 7 shows an example of a controller having communication function with the manufacturing apparatus and communication function with a control unit (or a controller attached to each apparatus) of each apparatus in the exhaust system. As shown in FIG. 7, the controller performs communication with the manufacturing apparatus 1 and communication with the control unit of each apparatus (the vacuum pump apparatus 3, the diluent N$_2$ unit 4, the exhaust gas treatment apparatus 5, the pipe heater 8, valves and the like) provided in the exhaust system 2.

FIG. 8 shows an example in which communication function with the manufacturing apparatus and communication function with each apparatus in the exhaust system are provided in a control unit attached to each apparatus in the exhaust system. In the embodiment shown in FIG. 8, the control unit of the exhaust gas treatment apparatus 5 has communication function with the manufacturing apparatus 1 and communication function with each apparatus in the exhaust system 2. In this case, an independent controller as shown in FIGS. 6 and 7 is unnecessary.

Although certain preferred embodiments of the present invention have been shown and described in detail, it should be understood that various changes and modifications may be made therein without departing from the scope of the appended claims.

INDUSTRIAL APPLICABILITY

The present invention is applicable to an exhaust system which has a vacuum pump for evacuating a chamber of the manufacturing apparatus, an exhaust gas treatment apparatus for treating an exhaust gas discharged from the chamber, and other apparatuses.

The invention claimed is:

1. An exhaust system for evacuating a chamber of a manufacturing apparatus for manufacturing semiconductor devices, liquid crystal panels, LEDs, or solar cells comprising:
a vacuum pump apparatus configured to evacuate said chamber;
an exhaust gas treatment apparatus configured to treat an exhaust gas discharged from said chamber;
a pipe for connecting said manufacturing apparatus, said vacuum pump apparatus and said exhaust gas treatment apparatus; and
a controller configured to control said vacuum pump apparatus and/or said exhaust gas treatment apparatus;
wherein information of operation process of said manufacturing apparatus, and the kind of gas and the flow rate of the gas supplied to said manufacturing apparatus is inputted into said controller to control said vacuum pump apparatus and/or said exhaust gas treatment apparatus;
wherein said vacuum pump apparatus comprises a first vacuum pump having two compression stages and a second vacuum pump having two compression stages, and a pump suction port connected to said chamber is provided in said first vacuum pump and a pump exhaust port connected to said exhaust gas treatment apparatus is provided in said second vacuum pump;
wherein pressure at an interstage part between said two compression stages of said second vacuum pump is measured by a pressure sensor, and said controller judges whether a process gas is introduced from said pump suction port to an interior of said first vacuum pump or not based on a measured pressure value; and
wherein said controller is configured to predict the time when maintenance is required of said vacuum pump apparatus or said exhaust gas treatment apparatus based at least in part on the kind of gas and quantity of the gas supplied to said manufacturing apparatus, and to output the prediction information to said manufacturing apparatus.

2. The exhaust system according to claim 1, wherein said controller is configured to control one or more of supply quantity of $N_2$ gas, supply quantity of water, electric power, supply quantities of fuel, oxygen and air, heater temperature, and plasma output based on the information of the operation process of said manufacturing apparatus and the kind of gas and the flow rate of the gas supplied to said manufacturing apparatus.

3. The exhaust system according to claim 1, wherein when maintenance is required for said vacuum pump apparatus or said exhaust gas treatment apparatus, said controller outputs information of maintenance request to said manufacturing apparatus.

4. The exhaust system according to claim 1, wherein said controller is configured to control rotational speeds of said vacuum pump apparatus based on the information of the operation process of said manufacturing apparatus and the kind of gas and the flow rate of the gas supplied to said manufacturing apparatus.

5. The exhaust system according to claim 3, wherein said information of maintenance request is obtained from the kind of gas and an accumulated supply quantity of the gas supplied to said manufacturing apparatus.

6. The exhaust system according to claim 1, further comprising:
an $N_2$ unit configured to supply an $N_2$ gas into the exhaust gas discharged from said chamber; and
wherein the information of the operation process of said manufacturing apparatus, and the kind of gas and the flow rate of the gas supplied to said manufacturing apparatus is inputted into said controller to control said $N_2$ unit.

7. The exhaust system according to claim 1, further comprising:
a pipe heater configured to heat at least part of said pipe for connecting said manufacturing apparatus, said vacuum pump apparatus and said exhaust gas treatment apparatus; and
wherein the information of the operation process of said manufacturing apparatus, and the kind of gas and the flow rate of the gas supplied to said manufacturing apparatus is inputted into said controller to control said pipe heater.

8. The exhaust system according to claim 1, wherein a cleaning gas is evacuated from said manufacturing apparatus to perform cleaning of each apparatus of said exhaust system.

9. The exhaust system according to claim 8, wherein when said vacuum pump apparatus, said exhaust gas treatment apparatus or said pipe is required for said cleaning due to powder adhesion of said vacuum pump apparatus, said exhaust gas treatment apparatus or said pipe, said controller outputs information of the cleaning request to said manufacturing apparatus.

10. The exhaust system according to claim 1, wherein said controller comprises a controller for controlling all the apparatuses of said exhaust system, or an individual controller for controlling each apparatus of said exhaust system.

11. A control method of an exhaust system for evacuating a chamber of a manufacturing apparatus for manufacturing semiconductor devices, liquid crystal panels, LEDs, or solar cells, said exhaust system comprising:
a vacuum pump apparatus configured to evacuate said chamber;
an exhaust gas treatment apparatus configured to treat an exhaust gas discharged from said chamber; and
a controller configured to control said vacuum pump apparatus and/or said exhaust gas treatment apparatus;
said control method comprising:
inputting information of operation process of said manufacturing apparatus, and the kind of gas and the flow rate of the gas supplied to said manufacturing apparatus into said controller to control said vacuum pump apparatus and/or said exhaust gas treatment apparatus;

wherein said vacuum pump apparatus comprises a first vacuum pump having two compression stages and a second vacuum pump having two compression stages, and a pump suction port connected to said chamber is provided in said first vacuum pump and a pump exhaust port connected to said exhaust gas treatment apparatus is provided in said second vacuum pump;

wherein pressure at an interstage part between said two compression stages of said second vacuum pump is measured by a pressure sensor, and said controller judges whether a process gas is introduced from said pump suction port to an interior of said first vacuum pump or not based on a measured pressure value; and wherein said controller is configured to predict the time when maintenance is required of said vacuum pump apparatus or said exhaust gas treatment apparatus based at least in part on the kind of gas and quantity of the gas supplied to said manufacturing apparatus or to predict the kind of gas to be treated and an available supply quantity of the gas to be treated until maintenance is required for said vacuum pump apparatus or said exhaust gas treatment apparatus, and to output the prediction information to said manufacturing apparatus.

12. The control method according to claim 11, further comprising outputting information of maintenance request from said controller to said manufacturing apparatus when maintenance is required for said vacuum pump apparatus or said exhaust gas treatment apparatus.

13. An exhaust system for evacuating a chamber of a manufacturing apparatus for manufacturing semiconductor devices, liquid crystal panels, LEDs, or solar cells comprising:

a vacuum pump apparatus configured to evacuate said chamber;

an exhaust gas treatment apparatus configured to treat an exhaust gas discharged from said chamber;

a pipe for connecting said manufacturing apparatus, said vacuum pump apparatus and said exhaust gas treatment apparatus; and a controller configured to control said vacuum pump apparatus and/or said exhaust gas treatment apparatus;

wherein information of operation process of said manufacturing apparatus, and the kind of gas and the flow rate of the gas supplied to said manufacturing apparatus is inputted into said controller to control said vacuum pump apparatus and/or said exhaust gas treatment apparatus;

wherein said vacuum pump apparatus comprises a first vacuum pump having two compression stages and a second vacuum pump having two compression stages, and a pump suction port connected to said chamber is provided in said first vacuum pump and a pump exhaust port connected to said exhaust gas treatment apparatus is provided in said second vacuum pump;

wherein pressure at an interstage part between said two compression stages of said second vacuum pump is measured by a pressure sensor, and said controller judges whether a process gas is introduced from said pump suction port to an interior of said first vacuum pump or not based on a measured pressure value; and wherein said controller is configured to predict the kind of gas to be treated and an available supply quantity of the gas to be treated until maintenance is required for said vacuum pump apparatus or said exhaust gas treatment apparatus, and to output the prediction information to said manufacturing apparatus.

* * * * *